(12) United States Patent
Chen et al.

(10) Patent No.: US 12,369,246 B2
(45) Date of Patent: Jul. 22, 2025

(54) SIDE WIRING STRUCTURE AND MANUFACTURING METHOD THEREOF

(71) Applicant: AUO Corporation, Hsinchu (TW)

(72) Inventors: Hsi-Hung Chen, Hsinchu (TW); Hao-An Chuang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 272 days.

(21) Appl. No.: 18/346,866

(22) Filed: Jul. 5, 2023

(65) Prior Publication Data

US 2024/0260174 A1 Aug. 1, 2024

(30) Foreign Application Priority Data

Jan. 30, 2023 (TW) .................. 112102967

(51) Int. Cl.
*H05K 1/02* (2006.01)
*H01L 25/075* (2006.01)

(52) U.S. Cl.
CPC .......... *H05K 1/028* (2013.01); *H01L 25/0753* (2013.01)

(58) Field of Classification Search
CPC ........................... H05K 1/028; H01L 25/0753
USPC ......................................................... 361/749
See application file for complete search history.

(56) References Cited

U.S. PATENT DOCUMENTS

| 2018/0076412 | A1* | 3/2018 | Kim | G06F 1/1637 |
|---|---|---|---|---|
| 2020/0004078 | A1* | 1/2020 | Yabuki | G02F 1/13452 |
| 2020/0301558 | A1 | 9/2020 | Luo et al. | |
| 2020/0303608 | A1 | 9/2020 | Song | |

FOREIGN PATENT DOCUMENTS

| CN | 208188804 | 12/2018 |
|---|---|---|
| CN | 112181200 | 1/2021 |
| CN | 114371793 | 4/2022 |
| CN | 113284416 | 3/2023 |
| EP | 3782191 | 2/2021 |
| TW | 202006448 | 2/2020 |

* cited by examiner

*Primary Examiner* — Binh B Tran

(74) *Attorney, Agent, or Firm* — JCIPRNET

(57) ABSTRACT

A side wiring structure includes a first substrate, a first wiring structure, a first side wire, a first insulating adhesive structure, a second side wire, a first flexible circuit board, and a second flexible circuit board. The first wiring structure is located on a first surface of the first substrate. The first side wire extends from the first wiring structure on the first surface to the second surface along the side surface on the first substrate. The first insulating adhesive structure is located above the first side wire and extends from above the first surface of the first substrate to above the side surface of the first substrate. The first insulating adhesive structure is located between the first and second side wires. The first and second flexible circuit boards are electrically connected to the first and second side wires, respectively.

19 Claims, 25 Drawing Sheets

SIDE WIRING STRUCTURE AND MANUFACTURING METHOD THEREOF

CROSS-REFERENCE TO RELATED APPLICATION

This application claims the priority benefit of Taiwan application serial no. 112102967, filed on Jan. 30, 2023. The entirety of the above-mentioned patent application is hereby incorporated by reference herein and made a part of this specification.

BACKGROUND

Technical Field

The disclosure relates to a side wiring structure and a manufacturing method thereof.

Description of Related Art

In response to market demands, an increasing number of manufacturers are actively engaged in the development of display panels that feature slim or frameless designs. Generally, in order to minimize the space occupied by a frame region of a display panel, a chip or a thin-film flip-chip packaging structure is positioned on either the back surface or the side surface of the display panel. One approach involves connecting a flexible circuit board to a pad situated on a front surface of the display panel, which is then bent towards the back surface. However, due to the relatively large thickness of the flexible circuit board and its inability to be fully adhered to the side surface of the display panel, achieving further reduction in the area occupied by the frame region becomes challenging.

SUMMARY

The disclosure provides a side wiring structure capable of effectively utilizing the space on a side surface of a substrate to layout side wires.

At least one embodiment of the disclosure provides a side wiring structure. The side wiring structure includes a first substrate, a first wiring structure, a first side wire, a first insulating adhesive structure, a second side wire, a first flexible circuit board, and a second flexible circuit board. The first substrate has a first surface, a second surface opposite to the first surface, and a side surface. The first wiring structure is located on the first surface of the first substrate. The first side wire extends from the first wiring structure on the first surface of the first substrate to the second surface of the first substrate along the side surface of the first substrate. The first insulating adhesive structure is located above the first side wire and extends from above the first surface of the first substrate to above the side surface of the first substrate. The first insulating adhesive structure is located between the first side wire and the second side wire. The first flexible circuit board is electrically connected to the first side wire. The second flexible circuit board is electrically connected to the second side wire.

A first substrate and a first wiring structure are provided, where the first substrate has a first surface, a second surface opposite to the first surface, and a side surface, and the first wiring structure is located on the first surface of the first substrate. A first side wire is formed on the first wiring structure, where the first side wire extends from the first wiring structure to above the second surface of the first substrate along the side surface of the first substrate. A first insulating adhesive structure is formed above the first side wire, and the first insulating adhesive structure extends from above the first surface of the first substrate to above the side surface of the first substrate. A second side wire is formed on the first insulating adhesive structure, where the first insulating adhesive structure is located between the first side wire and the second side wire. A first flexible circuit board is electrically connected to the first side wire. A second flexible circuit board is electrically connected to the second side wire.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2J are schematic cross-sectional views illustrating a manufacturing method of the side wiring structure depicted in FIG. 1.

DESCRIPTION OF THE EMBODIMENTS

Figure 1:
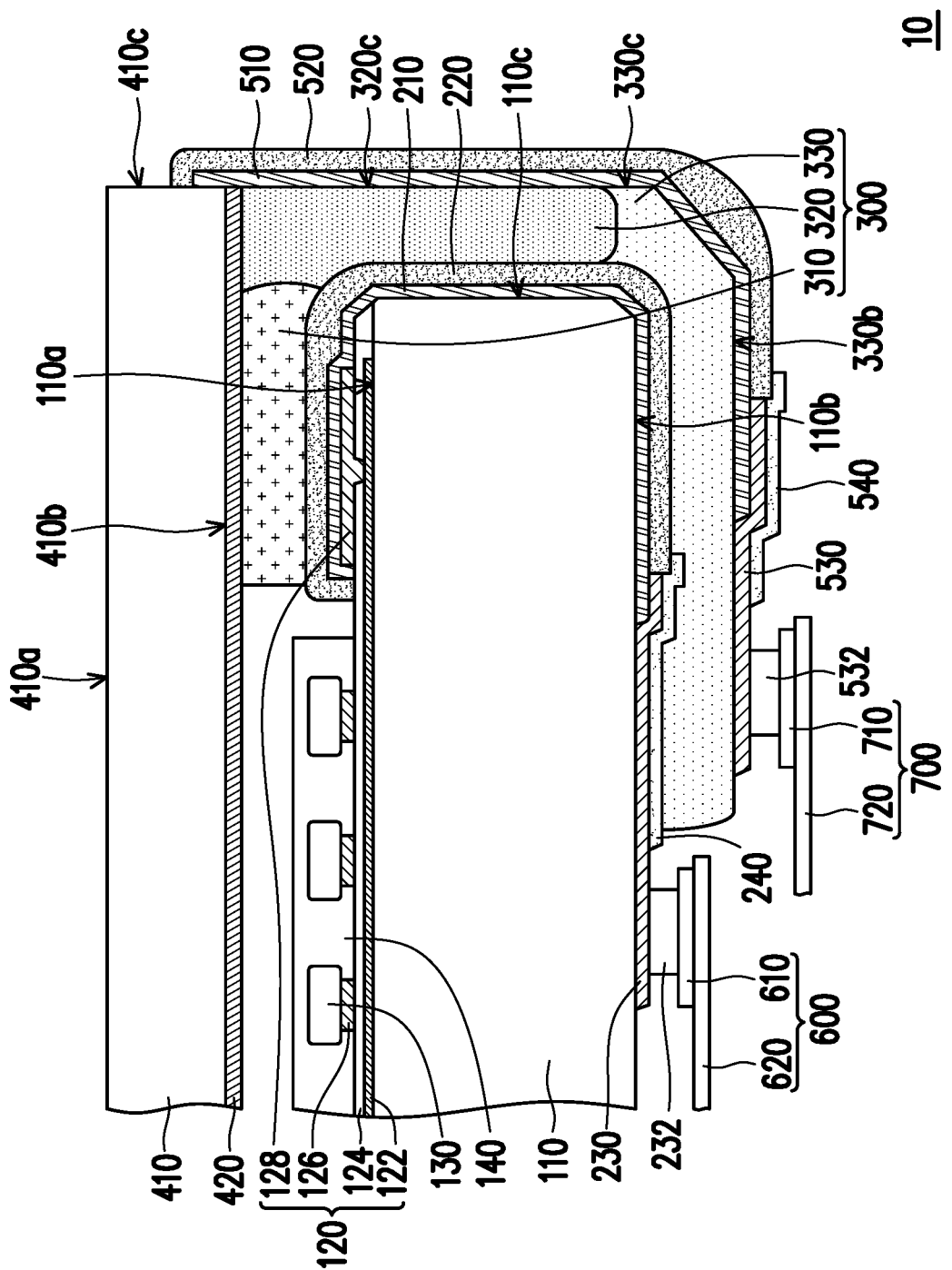
FIG. 1 is a schematic cross-sectional view of a side wiring structure according to an embodiment of the disclosure.

FIG. 1 is a schematic cross-sectional view of a side wiring structure 10 according to an embodiment of the disclosure. With reference to FIG. 1, the side wiring structure 10 includes a first substrate 110, a first wiring structure 120, a first side wire 210, a first insulating adhesive structure 300, a second side wire 510, a first flexible circuit board 620, and a second flexible circuit board 720. In this embodiment, the side wiring structure 10 further includes light-emitting devices 130, an encapsulation layer 140, a second substrate 410, a second wiring structure 420, a first protection layer 220, a second protection layer 520, a first extension line 230, a first cover layer 240, a second extension line 530, and a second cover layer 540.

The first substrate 110 has a first surface 110a, a second surface 110b opposite to the first surface 110a, and a side surface 110c. In some embodiments, the side surface 110c may optionally include inclined surfaces or rounded corners between the first surface 110a and the second surface 110b. In some embodiments, the substrate 110 is, for instance, a rigid substrate, and a material of the substrate 110 may be glass, quartz, organic polymer, or an opaque/a reflective material (such as a conductive material, metal, wafer, ceramics, or any other appropriate material), or any other appropriate material, which should not be construed as a limitation in the disclosure. In other embodiments, the first substrate 110 may also be a flexible substrate or a stretchable substrate. For instance, materials of the flexible substrate and the stretchable substrate include polyimide (PI), polydimethylsiloxane (PDMS), polyethylene terephthalate (PET), polyethylene naphthalate (PEN), polyester (PES), polymethylmethacrylate (PMMA), polycarbonate (PC), polyurethane (PU), or any other appropriate materials.

The first wiring structure 120 is located on the first surface 110a of the first substrate 110. The first wiring structure 120 includes a plurality of conductive layers and a plurality of insulating layers. For instance, the first wiring structure 120 includes a signal line 122, an insulating layer 124, pads 126, and a pad 128. In this embodiment, the insulating layer 124 is located on the signal line 122, and the pads 126 and 128 are located on the insulating layer 124. It should be mentioned that the conductive structures and the insulating layers in the first wiring structure 120 may be adjusted according to actual needs.

The light-emitting devices 130 are disposed on the first surface 110a of the first substrate 110. In some embodiments, the light-emitting devices 130 are bonded to the pads 126 of the first wiring structure 120. The light-emitting devices 130 may be, for instance, mini light-emitting diodes (mini-LED), micro-LEDs, or other types of LEDs. The encapsulation layer 140 is located above the first wiring structure 120 and covers the light-emitting devices 130.

The first side wire 210 extends from the first wiring structure 120 on the first surface 110a of the first substrate 110 to the second surface 110b of the first substrate 110 along the side surface 110c of the first substrate 110. In this embodiment, the first side wire 210 contacts the pad 128 of the first wiring structure 120 and extends from the pad 128 to above the second surface 110b of the first substrate 110 along the side surface 110c of the first substrate 110. In some embodiments, the first side wire 210 includes a single-layer or multi-layer structure. In some embodiments, a material of the first side wire 210 includes metal, a conductive adhesive, or any other appropriate conductive material.

The first protection layer 220 may be optionally disposed on the first side wire 210. The first protection layer 220 covers one portion of the first side wire 210, and the other portion of the first side wire 210 on the second surface 110b of the first substrate 110 is not covered by the first protection layer 220.

The first extension line 230 may be optionally disposed on the second surface 110b of the first substrate 110. The first extension line 230 is electrically connected to the first side wire 210. In this embodiment, the first extension line 230 partially covers the first side wire 210, which should not be construed as a limitation in the disclosure. In other embodiments, the first side wire 210 partially covers the first extension line 230. In other words, an order of forming the first extension line 230 and the first side wire 210 may be adjusted according to actual needs.

The first cover layer 240 is located on the first extension line 230 and partially covers the first extension line 230. In this embodiment, the first cover layer 240 contacts the first protection layer 220.

The first insulating adhesive structure 300 is located above the first side wire 210 and extends from above the first surface 110a of the first substrate 110 to the side surface 100c of the first substrate 110. In this embodiment, the first insulating adhesive structure 300 extends to the second surface 100b of the first substrate 110 along the side surface 110c of the first substrate 110. The first protection layer 220 is located between the first insulating adhesive structure 300 and the first side wire 210.

In this embodiment, the first insulating adhesive structure 300 includes a first insulating adhesive layer 310, a second insulating adhesive layer 320, and a third insulating adhesive layer 330 which are connected sequentially. The first insulating adhesive layer 310 is located between the first substrate 110 and the second substrate 410. The second insulating adhesive layer 320 is connected to the first insulating adhesive layer 310 and located above the side surface 110c of the first substrate 110. The third insulating adhesive layer 330 is connected to the second insulating adhesive layer 320 and located above the second surface 110b of the first substrate 110. In this embodiment, the first insulating adhesive layer 310, the second insulating adhesive layer 320, and the third insulating adhesive layer 330 include cured adhesive materials. In some embodiments, the first insulating adhesive layer 310, the second insulating adhesive layer 320, and the third insulating adhesive layer 330 include the same or different materials. In some embodiments, a material of the first insulating adhesive layer 310 includes a cured encapsulant, photoresist, a sealant, a gap-filling adhesive, or a combination thereof; while materials of the second insulating adhesive layer 320 and third insulating adhesive layer 330 include a cured glass adhesive, an encapsulant, a sealant, a gap-filling adhesive, or a combination thereof.

The second substrate 410 overlaps the first substrate 110. The second substrate 410 has a first surface 410a, a second surface 410b opposite to the first surface 410a, and a side surface 410c, where the second surface 410b of the second substrate 410 faces the first surface 110a of the first substrate 110. The second substrate 410 and the first substrate 110 may include the same or different materials. The second substrate 410 may be, for instance, a rigid substrate, and a material of the second substrate 410 may be glass, quartz, organic polymer, or any other appropriate material, which should not be construed as a limitation in the disclosure. In other embodiments, the second substrate 410 may also be a flexible substrate or a stretchable substrate.

The second wiring structure 420 is located on the second substrate 410. In this embodiment, the second wiring structure 420 is located on the second surface 410b of the second substrate 410. The second wiring structure 420 shown in FIG. 1 has a single-layer conductive structure, which should not be construed as a limitation in the disclosure. It should be mentioned that the conductive structure of the second wiring structure 420 may be adjusted according to actual needs. Specifically, the second wiring structure 420 may include one single conductive layer or a plurality of conductive layers and one single insulating layer or a plurality of insulating layers. In some embodiments, the second wiring structure 420 includes a photosensor (not shown), a touch sensor, a current sensor, a solar energy device, a light-emitting device, or any other electronic device.

In the first insulating adhesive structure 300, the first insulating adhesive layer 310 is applied to secure the first substrate 110 and the second substrate 410. In some embodiments, a portion of the first extension line 230 and a portion of the first cover layer 240 are located between the first substrate 110 and the first insulating adhesive structure 300, and a portion of the second wiring structure 420 is located between the first insulating adhesive layer 310 and the second substrate 410.

The second side wire 510 is located on the first insulating adhesive structure 300. The second side wire 510 extends from the first insulating adhesive structure 300 to the side surface 410c or the first surface 410a of the second substrate 410. In this embodiment, the second side wire 510 extends from the side surface 410c of the second substrate 410 to the first insulating adhesive structure 300. In this embodiment, the second side wire 510 further extends from the second wiring structure 420 to the side surface 330c of the third insulating adhesive layer 330 along the side surface 320c of the second insulating adhesive layer 320. The first insulating adhesive structure 300 is located between the first side wire 210 and the second side wire 510. In this embodiment, the second side wire 510 further extends to the bottom surface 330b of the third insulating adhesive layer 330. In this embodiment, the second side wire 510 contacts the second wiring structure 420 and extends from the second wiring structure 420 to above the second surface 110b of the first substrate 110. In some embodiments, the second side wire 510 includes a single-layer structure or a multi-layer structure. In some embodiments, a material of the second side wire 510 includes metal, a conductive adhesive, or any other appropriate conductive material.

A second protection layer 520 may be optionally disposed on the second side wire 510. The second side wire 510 is located between the first insulating adhesive structure 300 and the second protection layer 520. The second protection layer 520 covers one portion of the second side wire 510. The other portion of the second side wire 510 on the second surface 110b of the first substrate 110 is not covered by the second protection layer 520. In some embodiments, materials of the first protection layer 220 and the second protection layer 520 include silicon oxide, silicon nitride, silicon oxynitride, a cured encapsulant, an insulating adhesive, photoresist, a gap-filling adhesive, or any other appropriate material.

A second extension line 530 may be optionally disposed on the second surface 110b of the first substrate 110. The second extension line 530 is located on the first insulating adhesive structure 300. The second extension line 530 is electrically connected to the second side wire 510. In this embodiment, the second extension line 530 partially covers the second side wire 510, which should not be construed as a limitation in the disclosure. In other embodiments, the second side wire 510 partially covers the second extension line 530. In other words, an order of forming the second extension line 530 and the second side wire 510 may be adjusted according to actual needs.

The second cover layer 540 is located on the second extension line 530 and partially covers the second extension line 530. In this embodiment, the second cover layer 540 contacts the second protection layer 520. In some embodiments, materials of the first cover layer 240 and the second cover layer 540 include silicon oxide, silicon nitride, silicon oxynitride, a cured encapsulant, an insulating adhesive, photoresist, a gap-filling adhesive, or any other appropriate material.

The first flexible circuit board 620 is electrically connected to the first side wire 210. For instance, a thin-film flip-chip packaging structure 600 includes the first flexible circuit board 620 and a pin 610 located on the first flexible circuit board 620. The pin 610 is bonded to the first extension line 230 through a conductive connection structure 232, where the conductive connection structure 232 includes, for instance, a solder material, a conductive adhesive, or any other appropriate material. The first extension line 230 electrically connects the first flexible circuit board 620 to the first side wire 210. The first side wire 210 and the first extension line 230 electrically connect the first wiring structure 120 to the first flexible circuit board 620.

The second flexible circuit board 720 is electrically connected to the second side wire 510. For instance, a thin-film flip-chip packaging structure 700 includes the second flexible circuit board 720 and a pin 710 located on the second flexible circuit board 720. The pin 710 is bonded to the second extension line 530 through a conductive connection structure 532, where the conductive connection structure 532 includes, for instance, a solder material, a conductive adhesive, or any other appropriate material. The second extension line 530 electrically connects the second flexible circuit board 720 to the second side wire 510. The second side wire 510 electrically connects the second wiring structure 420 to the second flexible circuit board 720.

In this embodiment, a junction of the first flexible circuit board 620 and the first extension line 230 and a junction of the second flexible circuit board 720 and the second extension line 530 are both located above the second surface 110b of the first substrate 110, so as to utilize the space on the second surface 110b of the first substrate 110 more effectively.

Figure 2A:
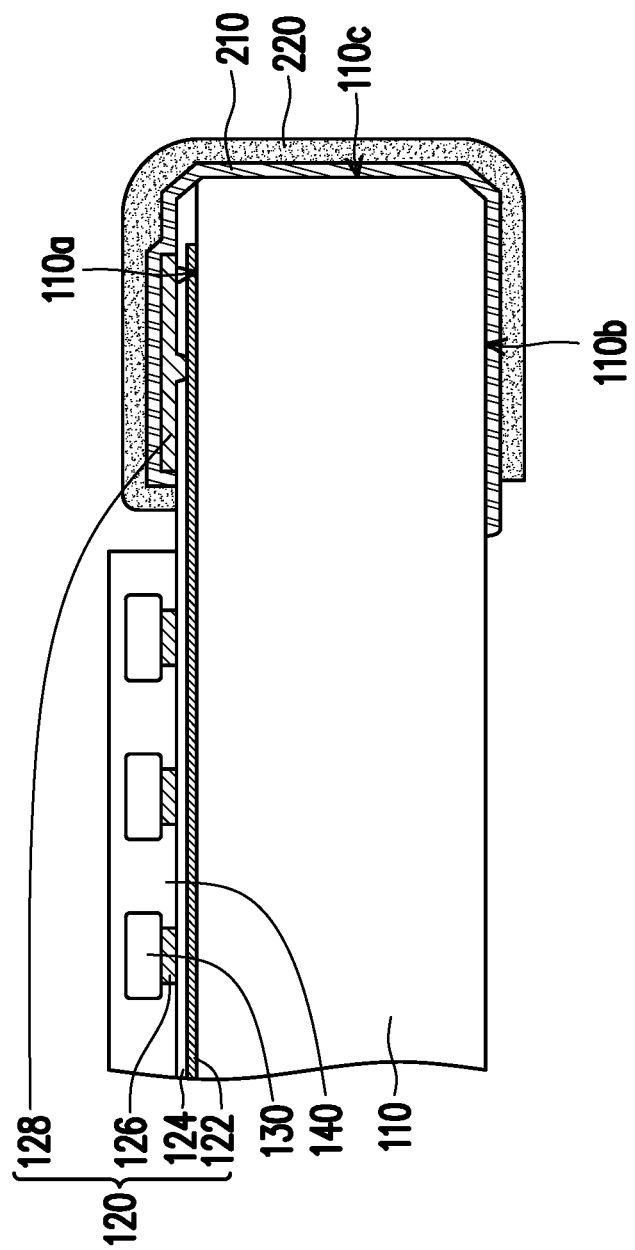

FIG. 2A to FIG. 2J are schematic cross-sectional views illustrating a manufacturing method of the side wiring structure depicted in FIG. 1. With reference to FIG. 2A, the first substrate 110 and the first wiring structure 120 are provided, and the first wiring structure 120 is located on the first surface 110a of the first substrate 110.

A plurality of the light-emitting devices 130 are provided on the first wiring structure 120. In some embodiments, the light-emitting devices 130 are formed on a growth substrate (not shown) and then transferred to the first wiring structure 120 through one or more mass-transfer processes.

The encapsulation layer 140 is formed on the light-emitting devices 130. In some embodiments, a method of forming the encapsulation layer 140 includes molding, bonding, or any other appropriate method.

The first side wire 210 is formed on the side surface 110c of the first substrate 110. In this embodiment, the first side wire 210 is formed on the first wiring structure 120, and the first side wire 210 extends from the first wiring structure 120 to above the second surface 110b of the first substrate 110 along the side surface 110c of the first substrate 110. In some embodiments, a method of forming the first side wire 210 includes transfer printing, screen printing, coating, sputtering, electroplating, inkjet printing, laser engraving, or any other appropriate method.

The first protection layer 220 is formed on the first side wire 210. In some embodiments, the first protection layer 220 completely covering the first side wire 210 is formed first, and a portion of the first protection layer 220 is removed through etching, developing, or laser engraving to expose a portion of the first side wire 210 located above the second surface 110b of the first substrate 110.

Figure 2B:
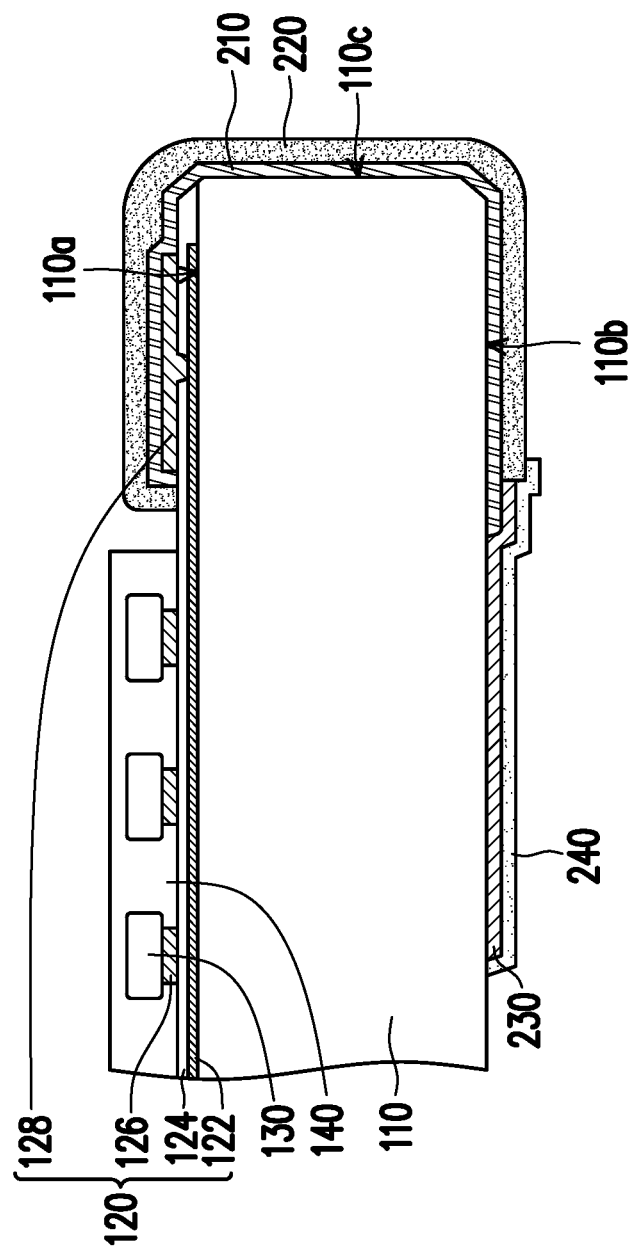

With reference to FIG. 2B, the first extension line 230 is formed above the second surface 110b of the first substrate 110, and the first side wire 210 is electrically connected to the first extension line 230. In some embodiments, a method of forming the first extension line 230 includes transfer printing, screen printing, coating, sputtering, electroplating, inkjet printing, laser engraving, or any other appropriate method. In some embodiments, the first side wire 210 and the first extension line 230 may be formed by applying the same or different methods.

The first cover layer 240 is formed on the first extension line 230. In some embodiments, a method of forming the first cover layer 240 includes physical vapor deposition, chemical vapor deposition, transfer printing, screen printing, coating, inkjet printing, laser engraving, or any other appropriate method.

With reference to FIG. 2C to FIG. 2F, the first insulating adhesive structure 300 is formed above the first side wire 210 and the first extension line 230, and the first insulating adhesive structure 300 is formed on the first protection layer 220. The first insulating adhesive structure 300 extends from above the first surface 110a of the first substrate 110 to above the side surface 110c and the second surface 110b of the first substrate 110.

Figure 2C:
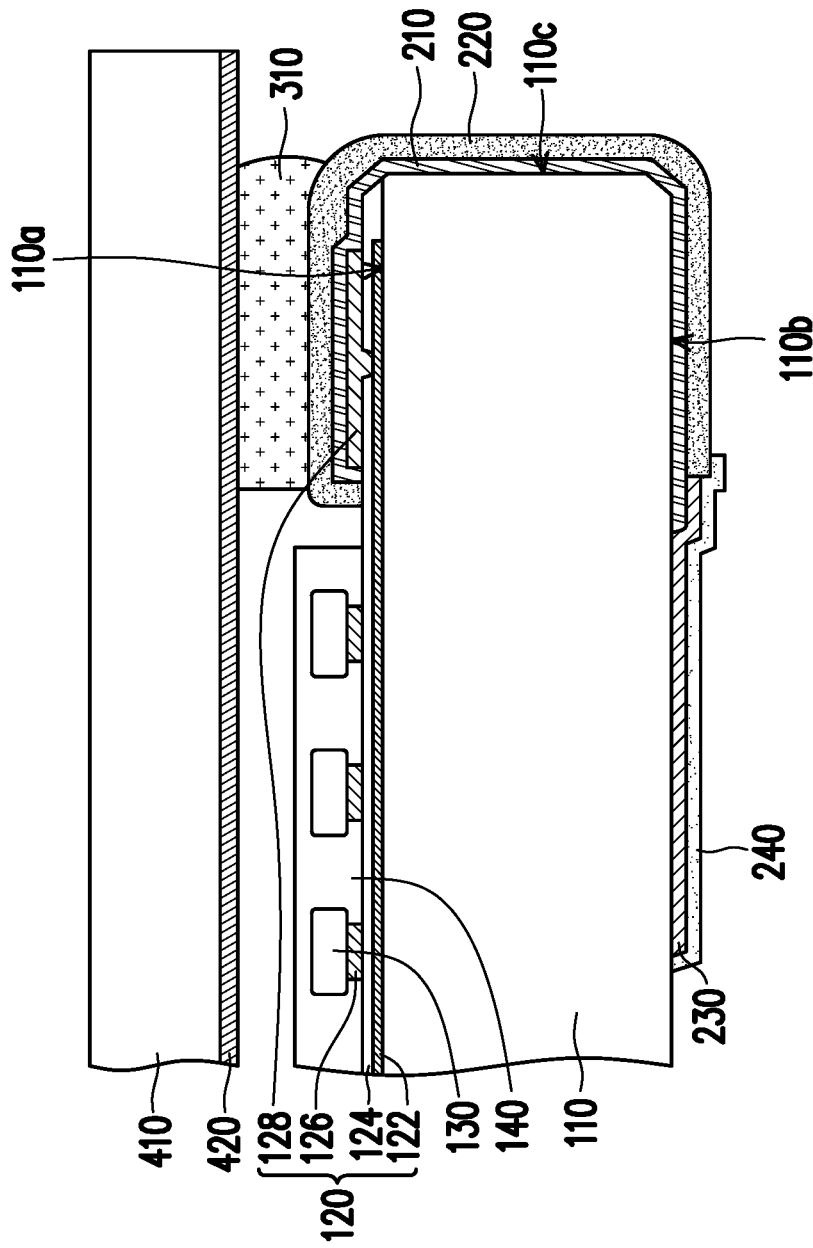

With reference to FIG. 2C, a first adhesive material layer 310' is formed on the first surface 110a of the first substrate 110. In this embodiment, the first adhesive material layer 310' is formed on the first protection layer 220. In some embodiments, a method of forming the first adhesive material layer 310' includes transfer printing, screen printing, coating, inkjet printing, or any other appropriate method.

Figure 2D:
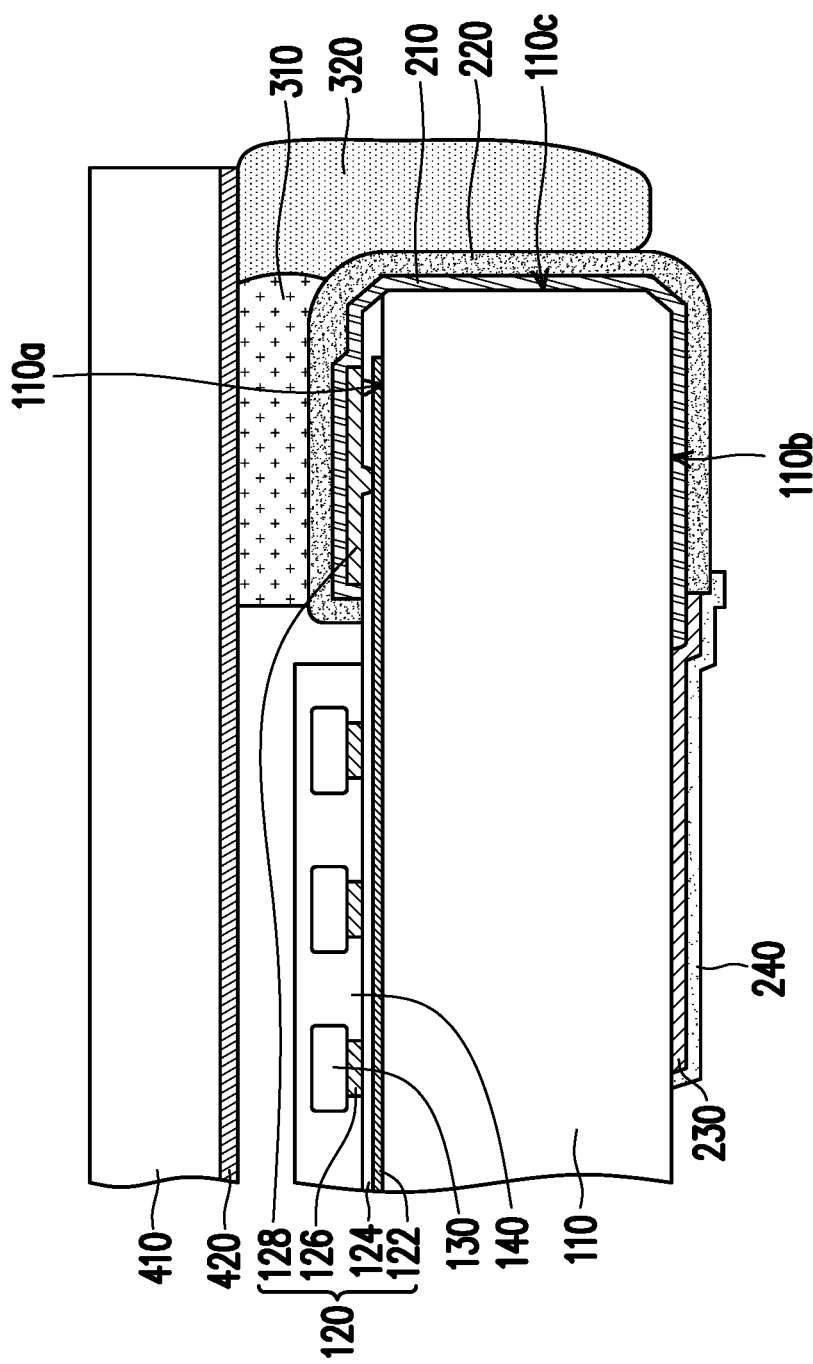

With reference to FIG. 2D, the second substrate 410 and the second wiring structure 420 located on the second substrate 410 are adhered to the first adhesive material layer 310'. The first adhesive material layer 310' is cured to form the first insulating adhesive layer 310, where the curing of the first adhesive material layer 310' may be carried out as photo-curing or thermal curing. Since the first adhesive material layer 310' is applied to adhere the second substrate 410 to the first substrate 110, a material with a relatively large viscosity is selected to form the first adhesive material layer 310'. In some embodiments, the material of the first adhesive material layer 310' includes an encapsulant, a sealant, a gap-filling adhesive, or a combination thereof.

Figure 2E:
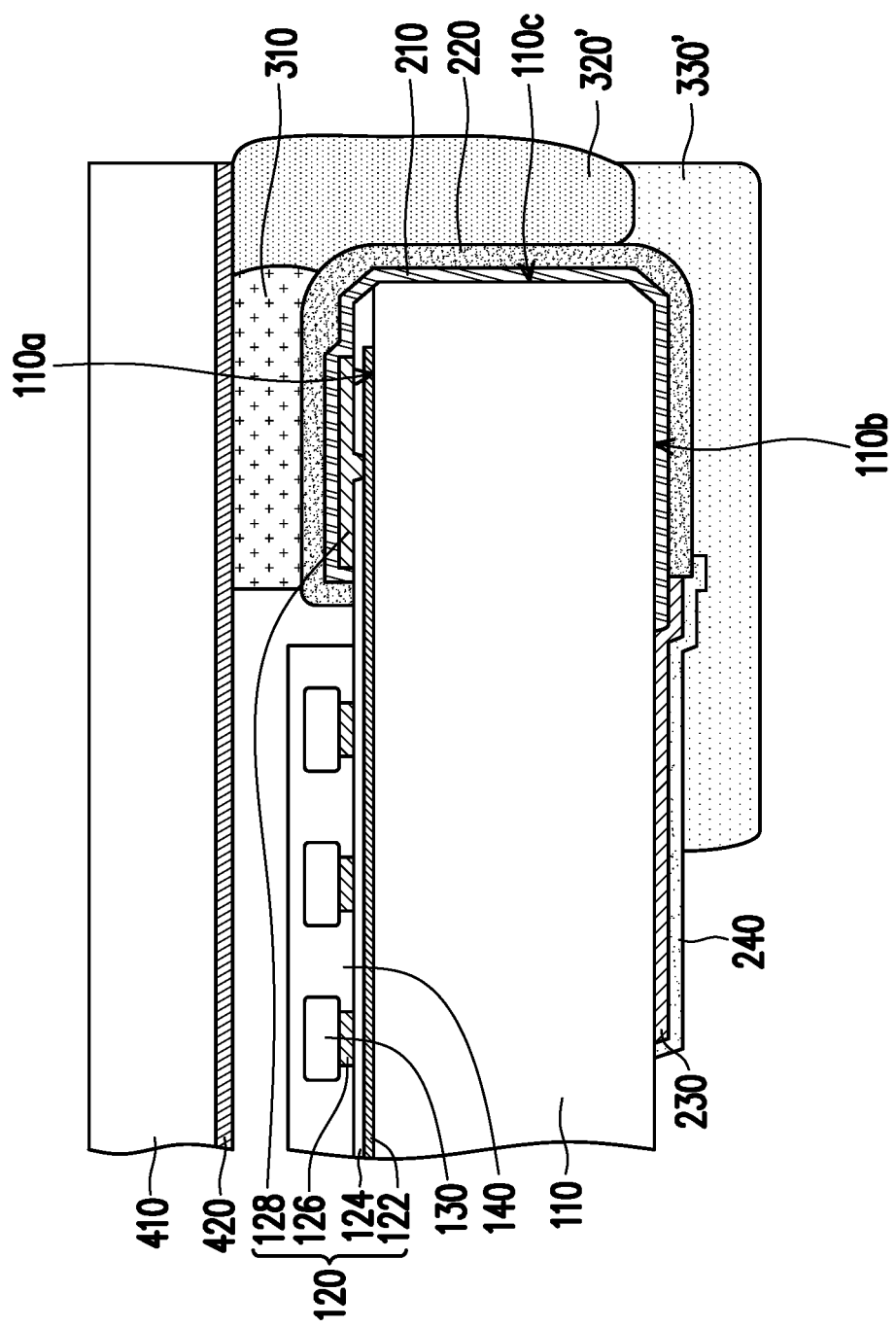

With reference to FIG. 2D and FIG. 2E, a second adhesive material layer 320' is formed on the first insulating adhesive layer 310. The second adhesive material layer 320' is located above the side surface 110c of the first substrate 110. A third adhesive material layer 330' is formed on the second surface 110b of the first substrate 110. In this embodiment, the second adhesive material layer 320' and the third adhesive material layer 330' are formed on the first protection layer 220, where the third adhesive material layer 330' further extends from the first protection layer 220 to the first cover layer 240. In some embodiments, methods of forming the second adhesive material layer 320' and the third adhesive material layer 330' include transfer printing, screen printing, coating, inkjet printing, or any other appropriate method.

In this embodiment, the second adhesive material layer 320' and the third adhesive material layer 330' are formed separately, which should not be construed as a limitation in the disclosure. In some embodiments, the second adhesive material layer 320' and the third adhesive material layer 330' are formed in the same process, and the second adhesive material layer 320' and the third adhesive material layer 330' may be integrally formed.

Figure 2F:
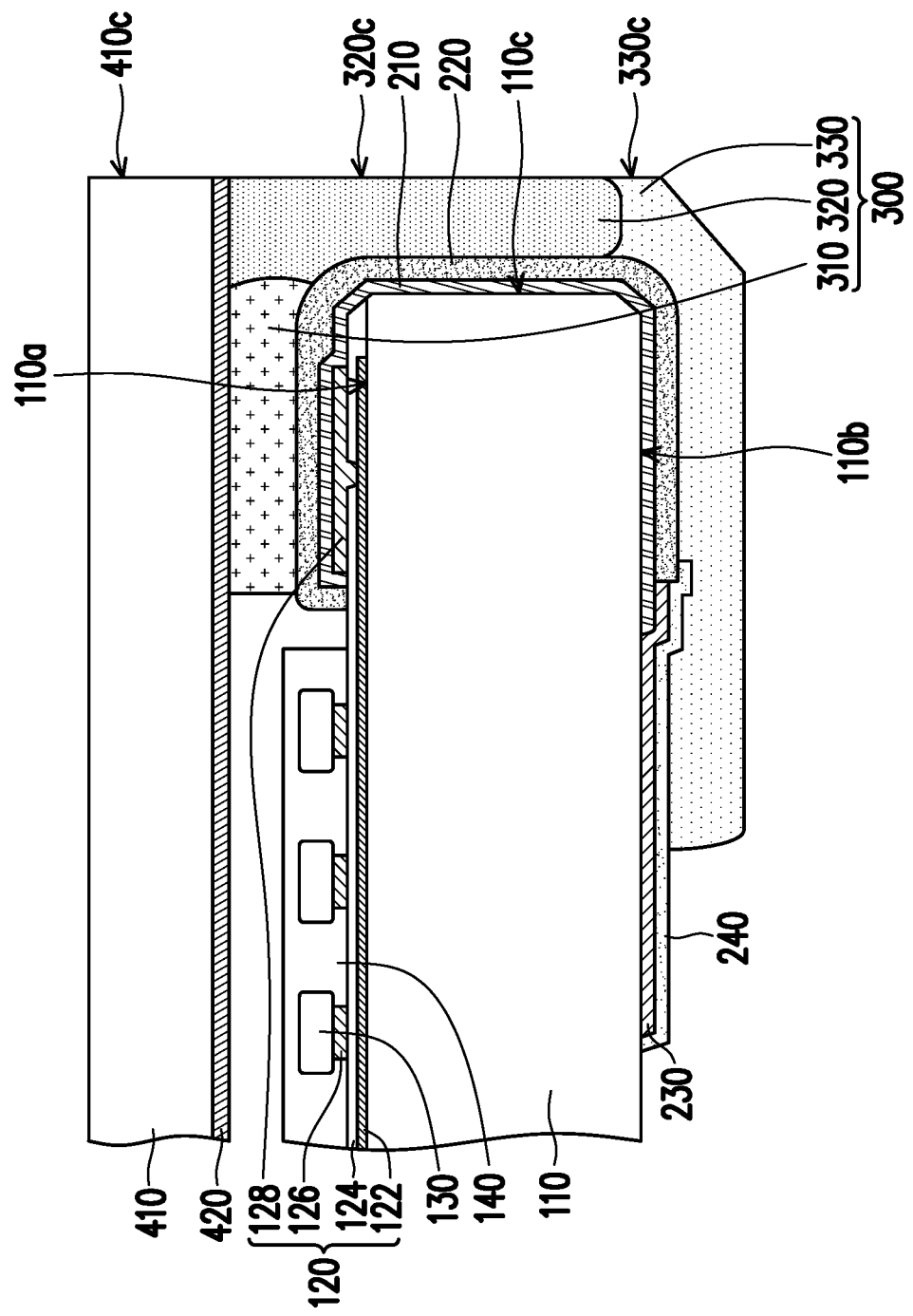

With reference to FIG. 2F, the second adhesive material layer 320' and the third adhesive material layer 330' are cured to form the second insulating adhesive layer 320 and the third insulating adhesive layer 330, where the curing of the second adhesive material layer 320' and the third adhesive material layer 330' may be carried out as photo-curing or thermal curing. In some embodiments, materials of the second adhesive material layer 320' and the third adhesive material layer 330' include a glass adhesive, an encapsulant, a sealant, a gap-filling adhesive, or a combination thereof.

The cured second adhesive material layer (i.e., the second insulating adhesive layer 320) and the second substrate 410 are simultaneously polished. In this embodiment, the cured third adhesive material layer (i.e., the third insulating adhesive layer 330) is also polished at the same time. In some embodiments, the side surface 320c of the second insulating adhesive layer 320, the side surface 330c of the third insulating adhesive layer 330, and the side surface 410c of the second substrate 410 are aligned.

Figure 2G:
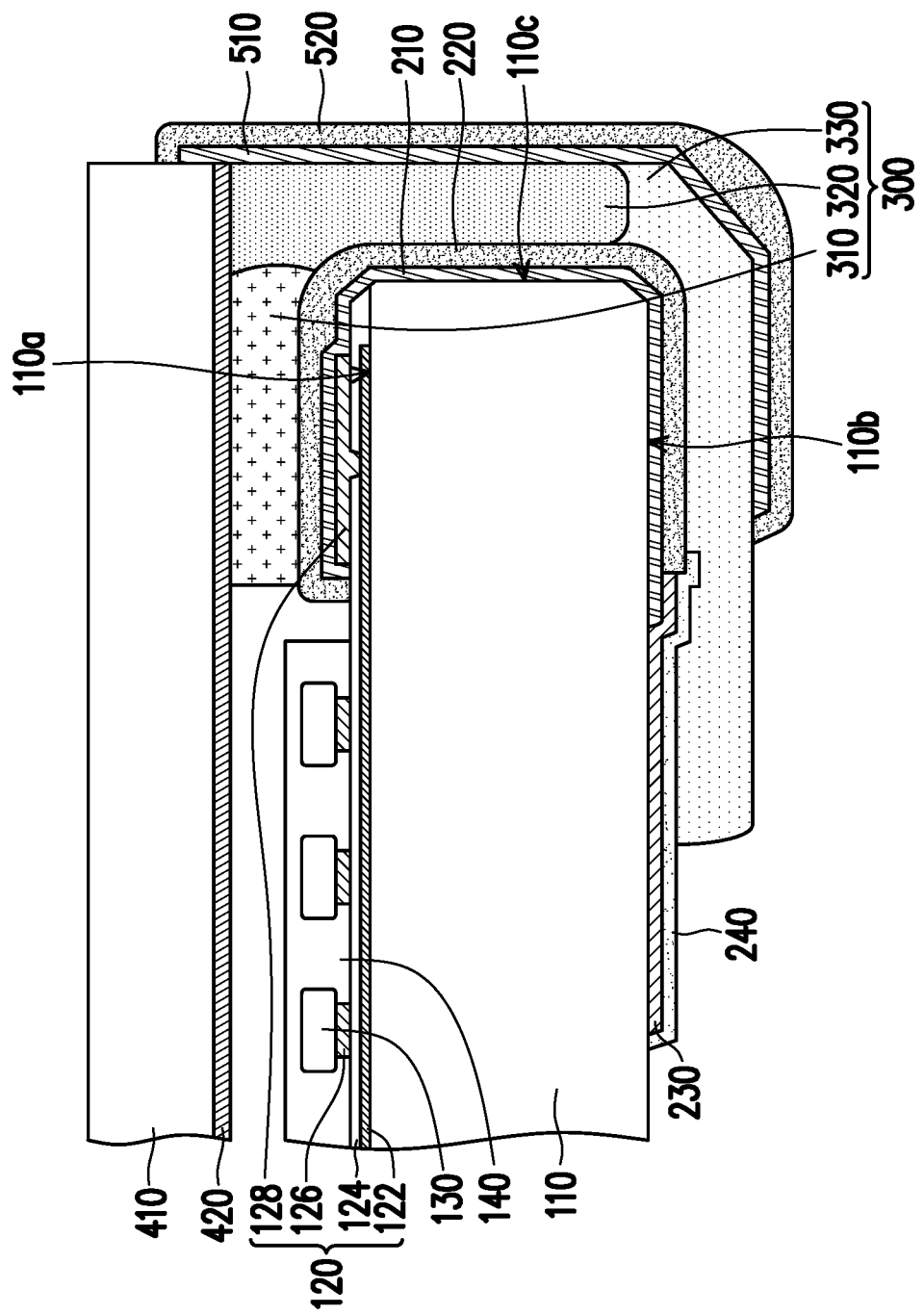
Figure 2H:
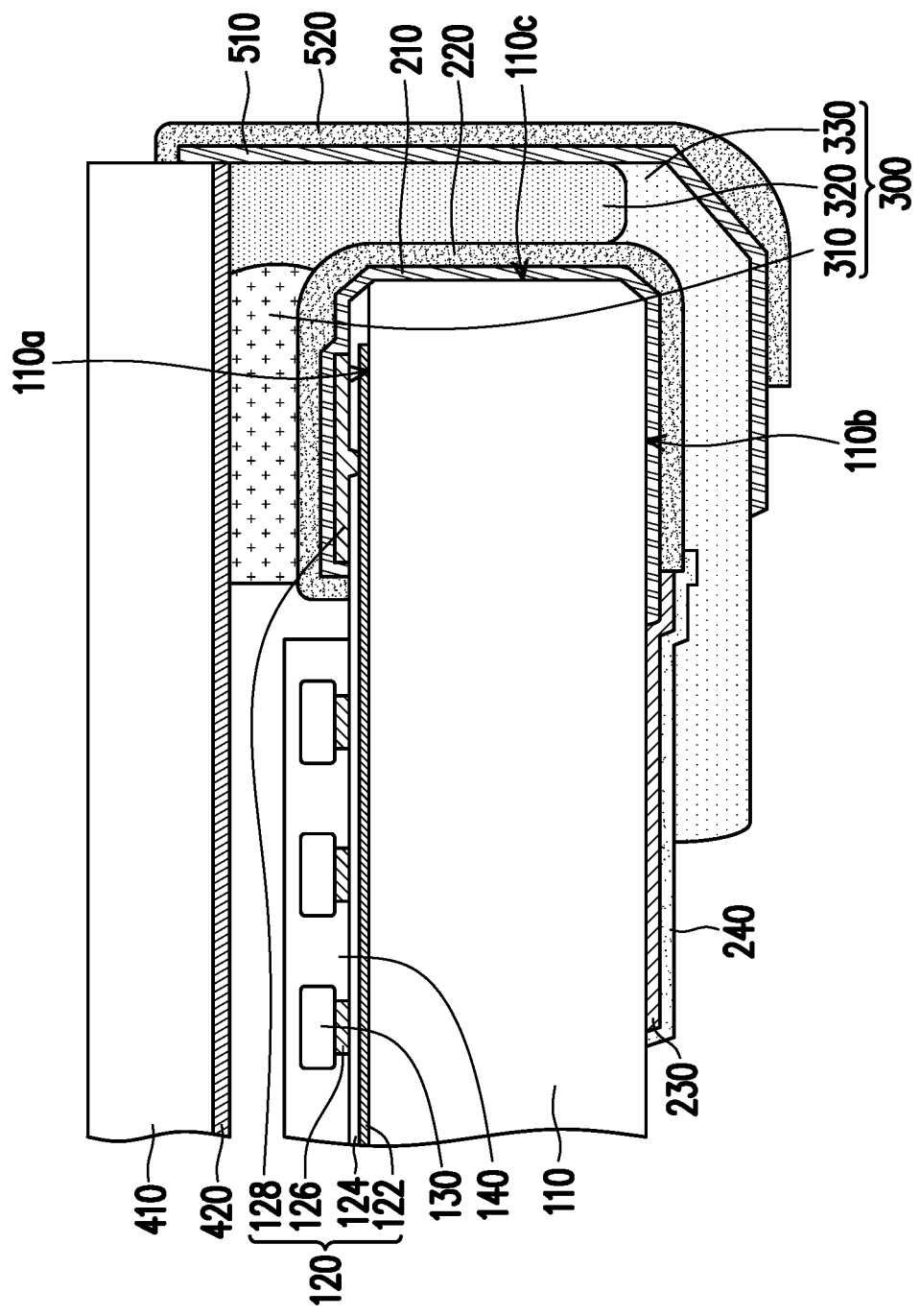
Figure 21:
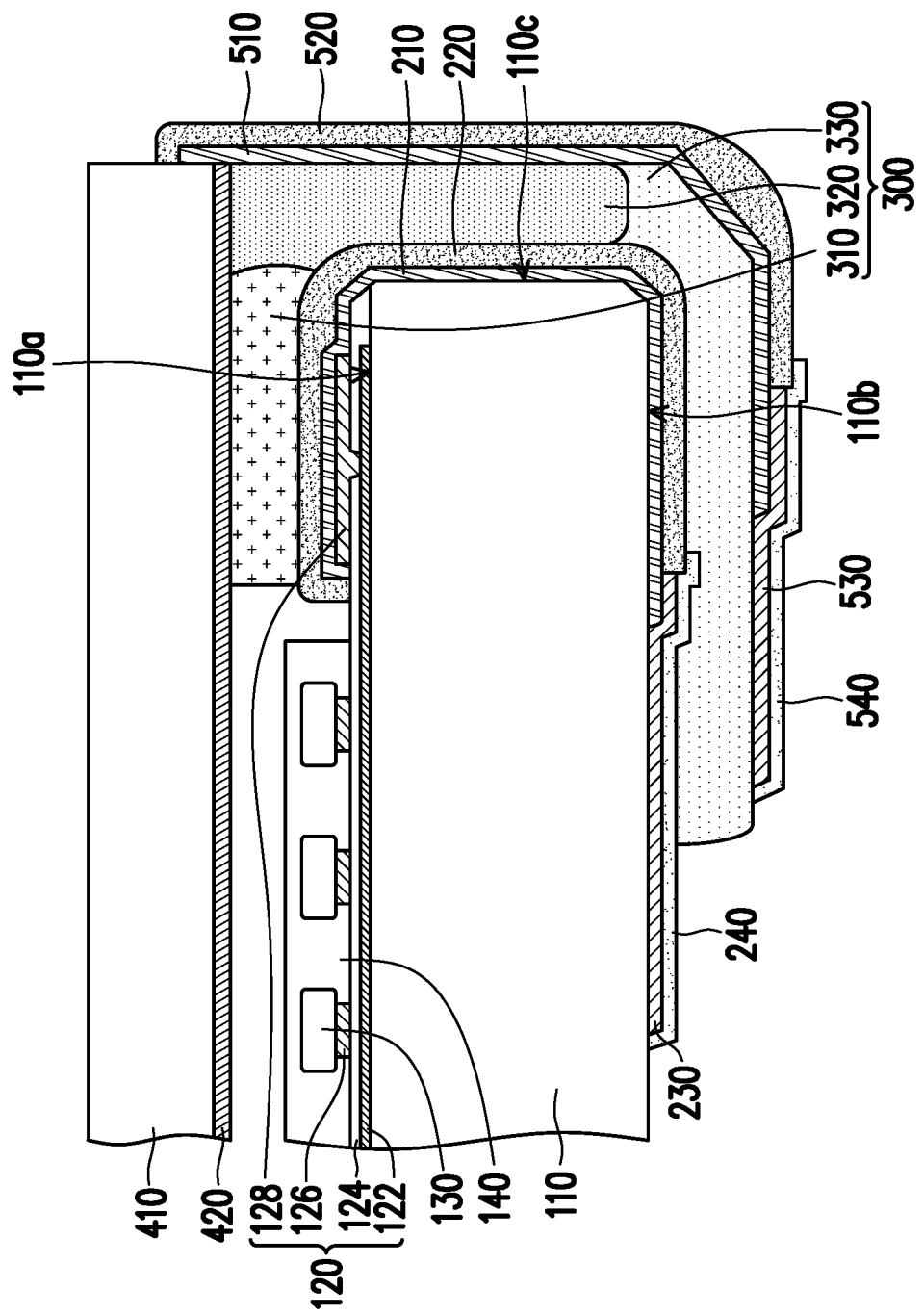

With reference to FIG. 2G and FIG. 2H, the second side wire 510 is formed on the first insulating adhesive structure 300. In this embodiment, the second side wire 510 is formed on the cured second adhesive material layer (i.e., the second insulating adhesive layer 320), the cured third adhesive material layer (i.e., the third insulating adhesive layer 330), and the second substrate 410. In some embodiments, a method of forming the second side wire 510 includes transfer printing, screen printing, coating, sputtering, electroplating, inkjet printing, laser engraving, or any other appropriate method.

The second protection layer 520 is formed on the second side wire 510. In some embodiments, the second protection layer 520 that completely covers the second side wire 510 (as shown in FIG. 2G) is formed, and then a portion of the second protection layer 520 is removed through etching, developing, or laser engraving to expose a portion of the second side wire 510 above the second surface 110b of the first substrate 110 (as shown in FIG. 2H).

With reference to FIG. 2I, the second extension line 530 is formed on the first insulating adhesive structure 300, and the second side wire 510 is electrically connected to the second extension line 530. In some embodiments, a method of forming the second extension line 530 includes transfer printing, screen printing, coating, sputtering, electroplating, inkjet printing, laser engraving, or any other appropriate method. In some embodiments, the second side wire 510 and the second extension line 530 may be formed by applying the same or different methods.

The second cover layer 540 is formed on the second extension line 530. In some embodiments, a method of forming the second cover layer 540 includes physical vapor deposition, chemical vapor deposition, transfer printing, screen printing, coating, inkjet printing, laser engraving, or any other appropriate method.

Figure 2J:
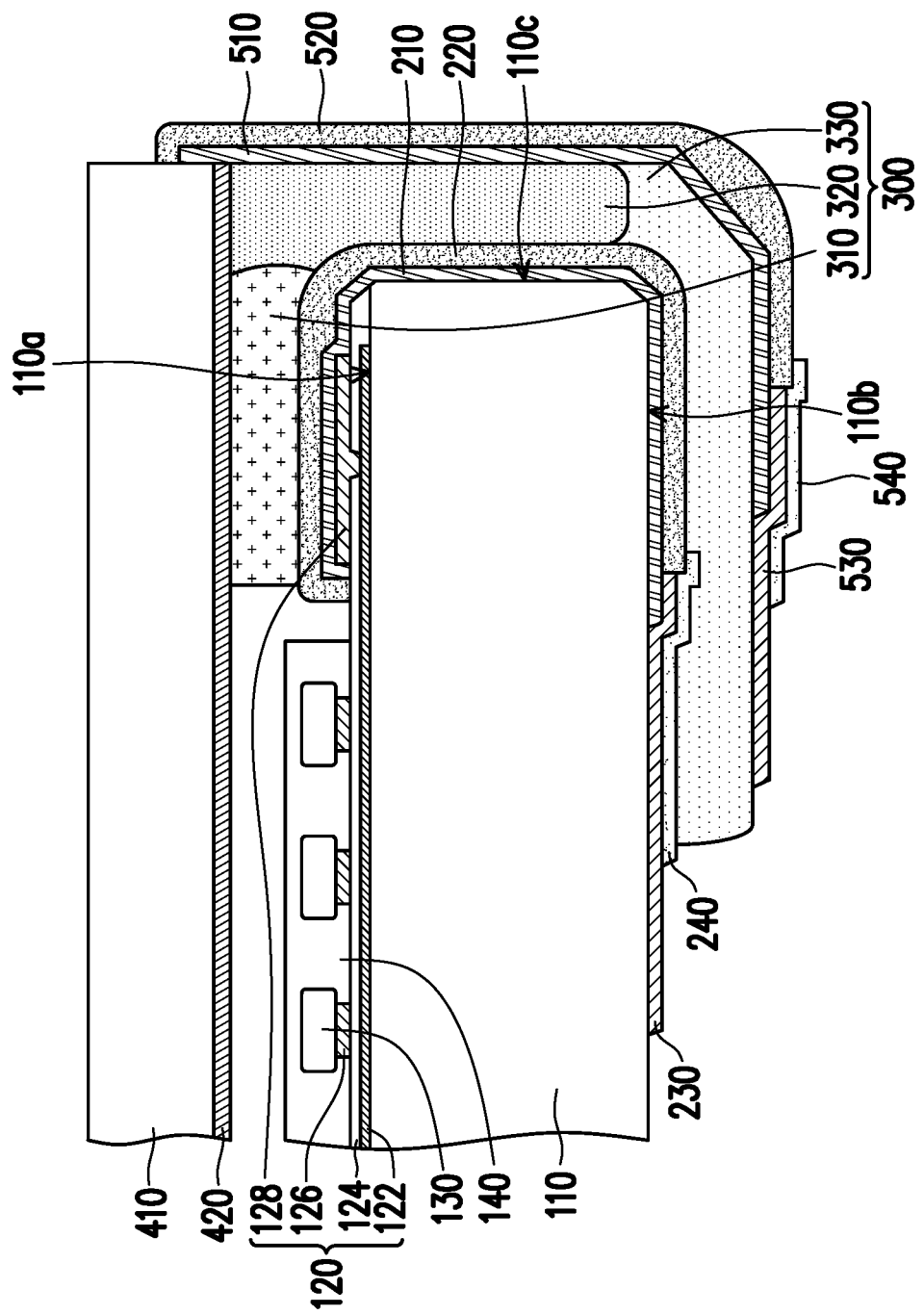

With reference to FIG. 2J, the first cover layer 240 and the second cover layer 540 are etched, so as to expose a portion of the first extension line 230 and a portion of the second extension line 530.

With reference back to FIG. 1, the first flexible circuit board 620 is electrically connected to the first side wire 210, and the second flexible circuit board 720 is electrically connected to the second side wire 510.

In light of the foregoing, the first insulating adhesive structure 300 allows the effective utilization of the wiring space above the side surface 110c of the first substrate 110, so that the first wiring structure 120 and the second wiring structure 420 may be electrically connected to the first flexible circuit board 620 and the second flexible circuit board 720 through the first side wire 210 and the second side wire 510 located in different film layers. In addition, the first insulating adhesive structure 300 not only lessens the possibility of short circuits of the first side wire 210 and the second side wire 510 but also reduces parasitic capacitance between the first side wire 210 and the second side wire 510.

Figure 3:
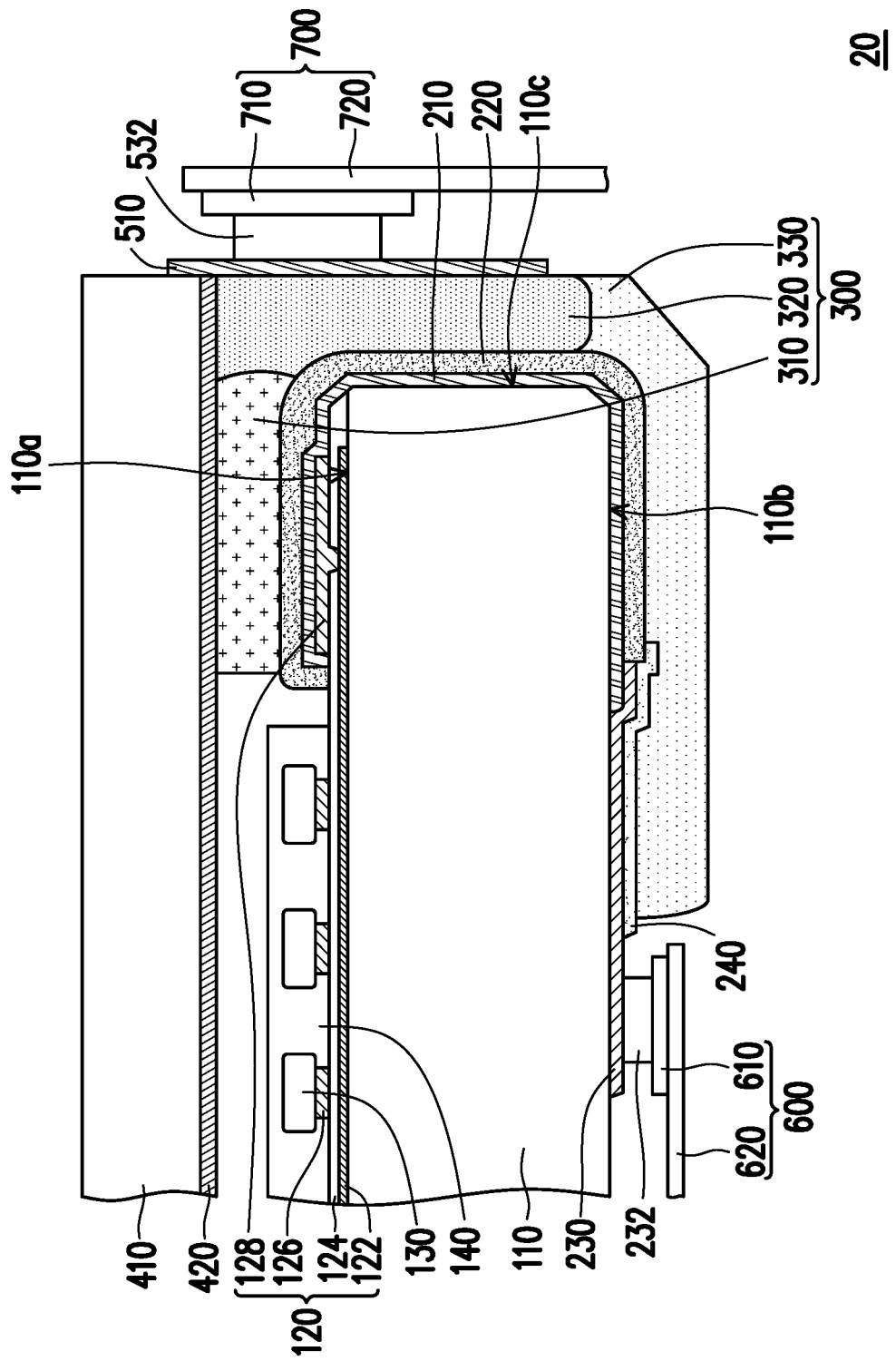
FIG. 3 is a schematic cross-sectional view of a side wiring structure according to an embodiment of the disclosure.

FIG. 3 is a schematic cross-sectional view of a side wiring structure 20 according to an embodiment of the disclosure. Note that the reference numbers and some contents applied in the embodiment depicted in FIG. 3 are derived from the embodiment depicted in FIG. 1, the same or similar reference numbers denote the same or like devices, and the same technical contents are omitted. The description of the omitted parts may be referred to as that provided in the previous embodiments and thus will not be repeated hereinafter.

The main difference between the side wiring structure 20 in FIG. 3 and the side wiring structure 10 in FIG. 1 lies in that the second flexible circuit board 720 of the side wiring structure 20 is disposed on the side surface 110c of the first substrate 110, where the junction of the second flexible circuit board 720 and the second side wire 510 is located above the side surface 110c of the first substrate 110. In addition, in the side wiring structure 20, a pin 710 of the thin-film flip-chip packaging structure 700 is connected to the second side wire 510, and thus the second extension line and the second cover layer may be omitted. In this embodiment, the second side wire 510 does not extend to the third insulating adhesive layer 330, and the third insulating adhesive layer 330 may be omitted.

Figure 4:
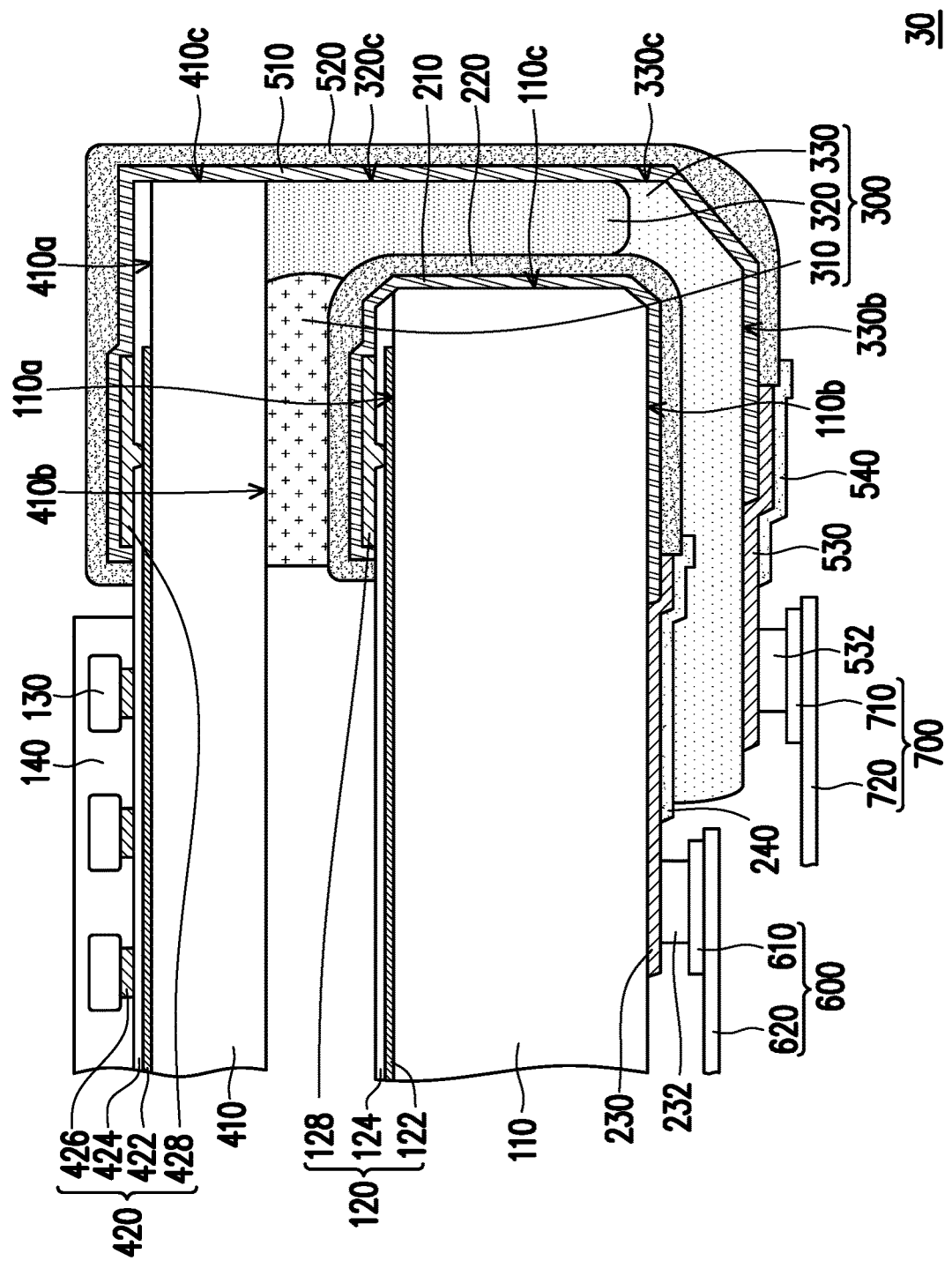
FIG. 4 is a schematic cross-sectional view of a side wiring structure according to an embodiment of the disclosure.

FIG. 4 is a schematic cross-sectional view of a side wiring structure 30 according to an embodiment of the disclosure. Note that the reference numbers and some contents applied in the embodiment depicted in FIG. 4 are derived from the embodiment depicted in FIG. 1, the same or similar reference numbers denote the same or like devices, and the same technical contents are omitted. The description of the omitted parts may be referred to as that provided in the previous embodiments and thus will not be repeated hereinafter.

The main difference between the side wiring structure 30 in FIG. 4 and the side wiring structure 10 in FIG. 1 lies in that in the side wiring structure 30, the second wiring structure 420, the light-emitting devices 130, and the encapsulation layer 140 are located above the first surface 410a of the second substrate 410. In other embodiments, the second wiring structure 420, the light-emitting devices 130, and the encapsulation layer 140 are located below the second surface 410b of the second substrate 410.

The second wiring structure 420 includes a plurality of conductive layers and a plurality of insulating layers. For instance, the second wiring structure 420 includes a signal line 422, an insulating layer 424, pads 426, and a pad 428. In this embodiment, the insulating layer 424 is located above the signal line 422, and the pads 426 and 428 are located on the insulating layer 424. It should be mentioned that the conductive structures and the insulating layers in the second wiring structure 420 may be adjusted according to actual needs.

The light-emitting devices 130 are disposed above the first surface 410a of the second substrate 410. In some embodiments, the light-emitting devices 130 are bonded to the pads 426 of the second wiring structure 420. The encapsulation layer 140 is located above the second wiring structure 420 and covers the light-emitting devices 130.

The second side wire 510 extends from the second wiring structure 420 on the first surface 410a of the second substrate 410 to the bottom surface 330b of the third insulating adhesive layer 330 along the side surface 410c of the second substrate 410, the side surface 320c of the second insulating adhesive layer 320, and the side surface 330c of the third insulating adhesive layer 330. A portion of the second side wire 510 is located above the second surface 110b of the first substrate 110. In this embodiment, the second side wire 510 contacts the pad 428 of the second wiring structure 420.

In some embodiments, the first wiring structure 120 includes a photosensor (not shown), a touch sensor, a current sensor, a solar energy device, a light-emitting device, or any other electronic device.

Figure 5:
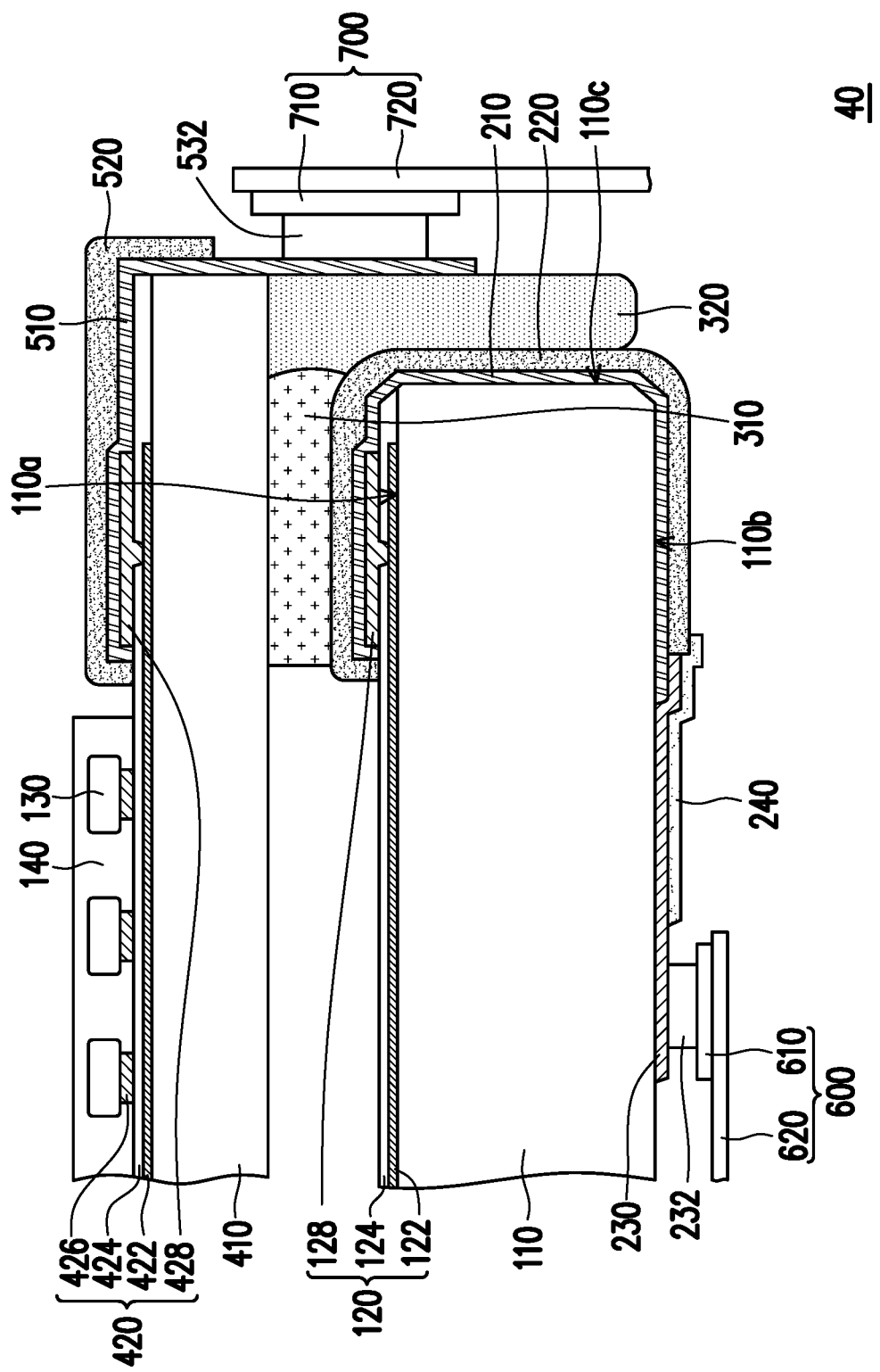
FIG. 5 is a schematic cross-sectional view of a side wiring structure according to an embodiment of the disclosure.

FIG. 5 is a schematic cross-sectional view of a side wiring structure 40 according to an embodiment of the disclosure. Note that the reference numbers and some contents applied in the embodiment depicted in FIG. 5 are derived from the embodiment depicted in FIG. 4, the same or similar reference numbers denote the same or like devices, and the same technical contents are omitted. The description of the omitted parts may be referred to as that provided in the previous embodiments and thus will not be repeated hereinafter.

The main difference between the side wiring structure 40 in FIG. 5 and the side wiring structure 30 in FIG. 4 lies in that the second flexible circuit board 720 of the side wiring structure 40 is disposed above the side surface 110c of the first substrate 110, where the junction of the second flexible circuit board 720 and the second side wire 510 is located above the side surface 110c of the first substrate 110.

Figure 6A:
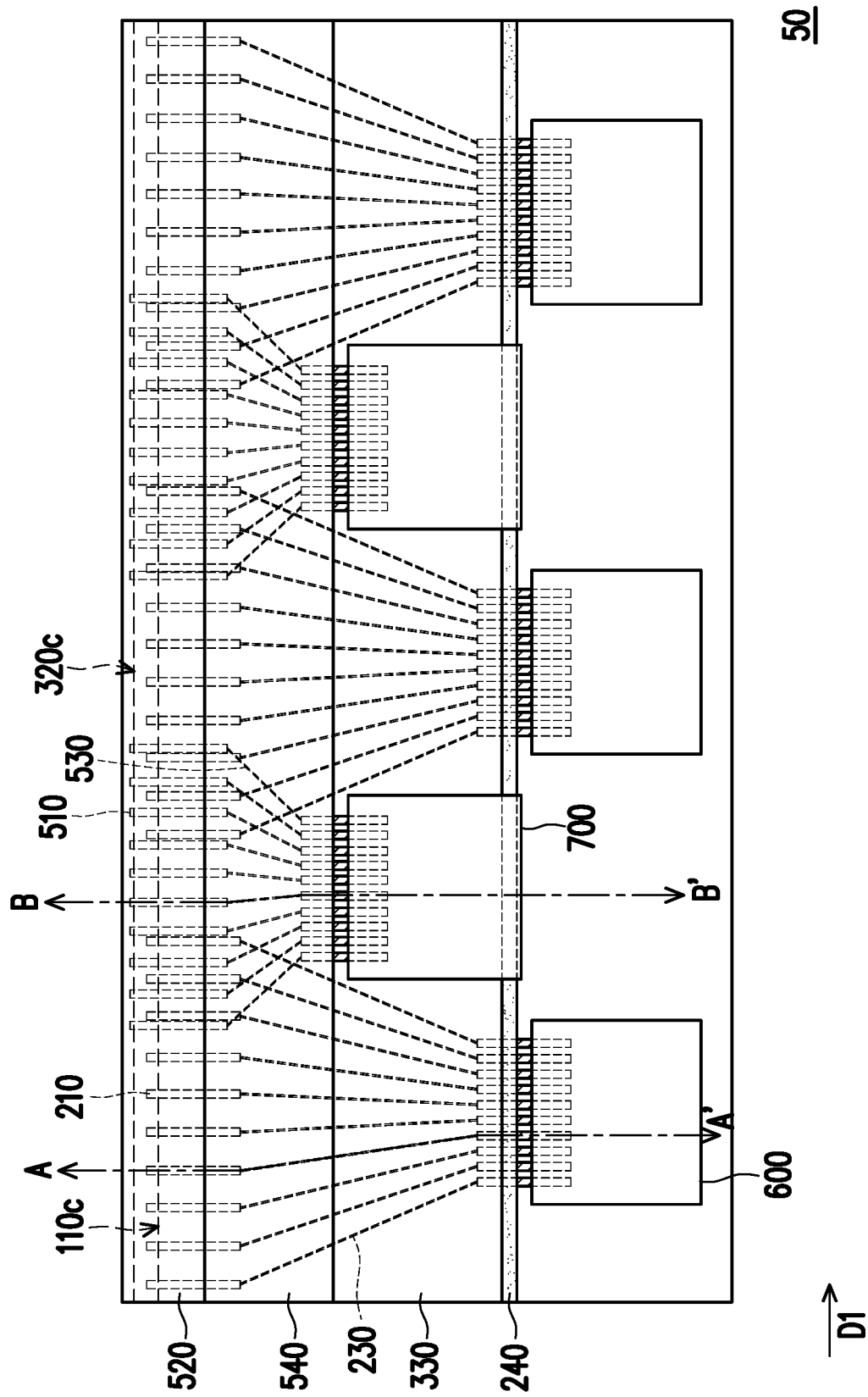
FIG. 6A is a schematic bottom view of a side wiring structure according to an embodiment of the disclosure.
Figure 6B:
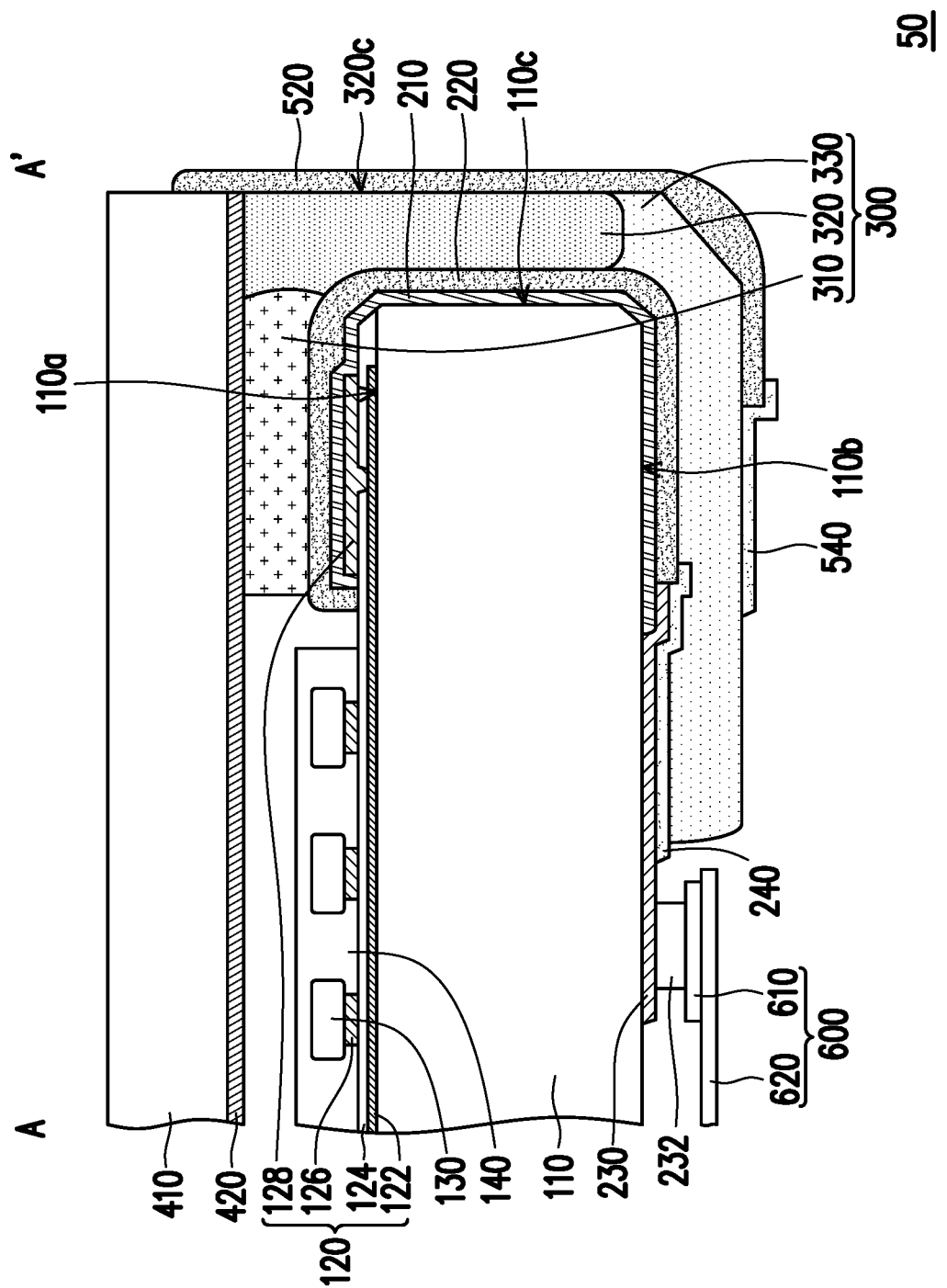
FIG. 6B is a schematic cross-sectional view taken along a sectional line A-A' in FIG. 6A.
Figure 6C:
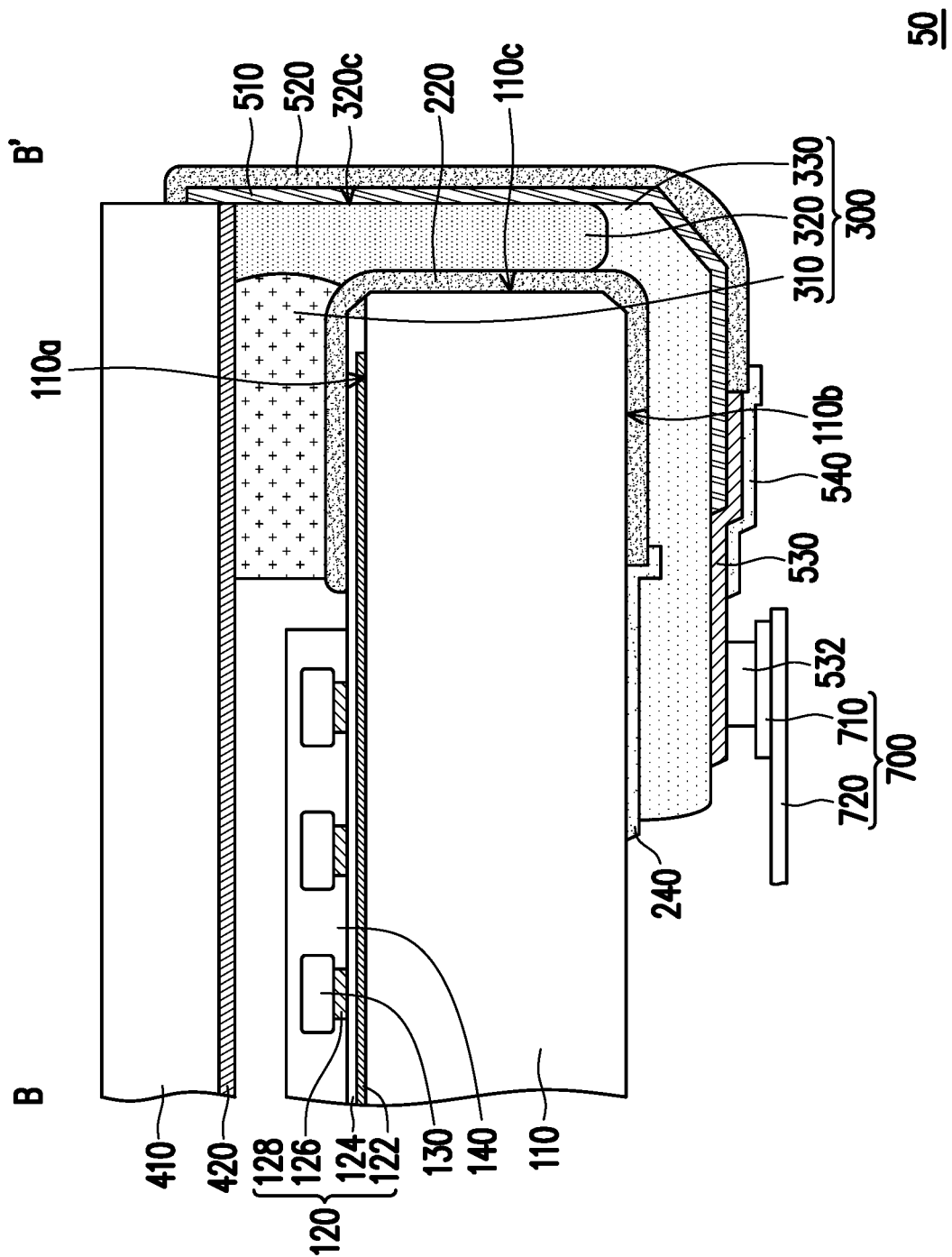
FIG. 6C is a schematic cross-sectional view taken along a sectional line B-B' in FIG. 6A.

FIG. 6A is a schematic bottom view of a side wiring structure 50 according to an embodiment of the disclosure. FIG. 6B is a schematic cross-sectional view taken along a sectional line A-A' in FIG. 6A. FIG. 6C is a schematic cross-sectional view taken along a sectional line B-B' in FIG. 6A. Note that the reference numbers and some contents applied in the embodiment depicted in FIG. 6A to FIG. 6C are derived from the embodiment depicted in FIG. 1, the same or similar reference numbers denote the same or like devices, and the same technical contents are omitted. The description of the omitted parts may be referred to as that provided in the previous embodiments and thus will not be repeated hereinafter.

With reference to FIG. 6A to FIG. 6C, the first flexible circuit board of the thin-film flip-chip packaging structure 600 and the second flexible circuit board of the thin-film flip-chip packaging structure 700 are alternately arranged in a first direction D1, where the first direction D1 is parallel to the side surface 110c of the first substrate 110. In this embodiment, a plurality of the thin-film flip-chip packaging structures 600 are arranged in a row in the first direction D1, and a plurality of the thin film over chip packaging structures 700 are arranged in another row in the first direction D1.

Figure 7A:
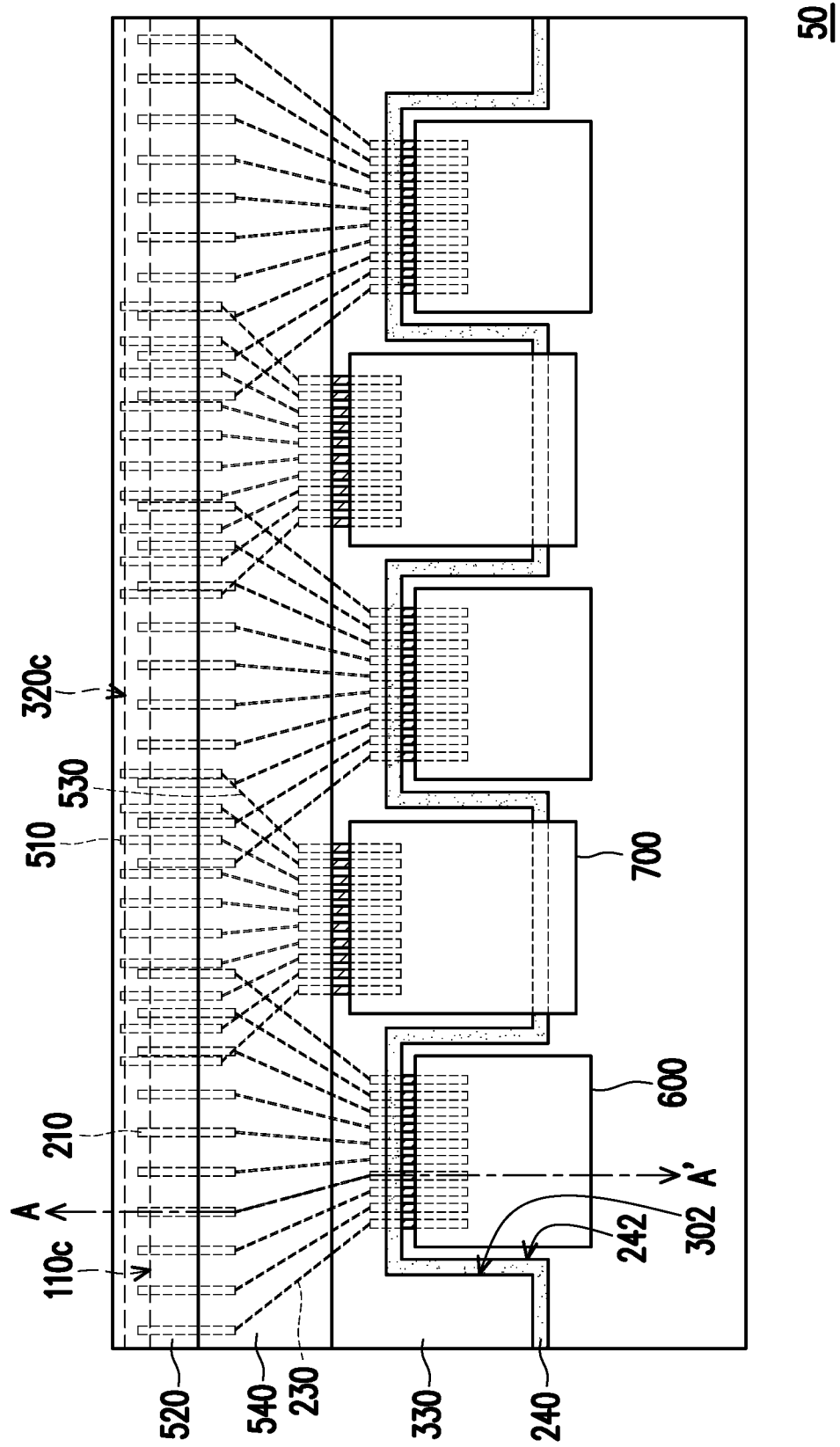
FIG. 7A is a schematic bottom view of a side wiring structure according to an embodiment of the disclosure.
Figure 7B:
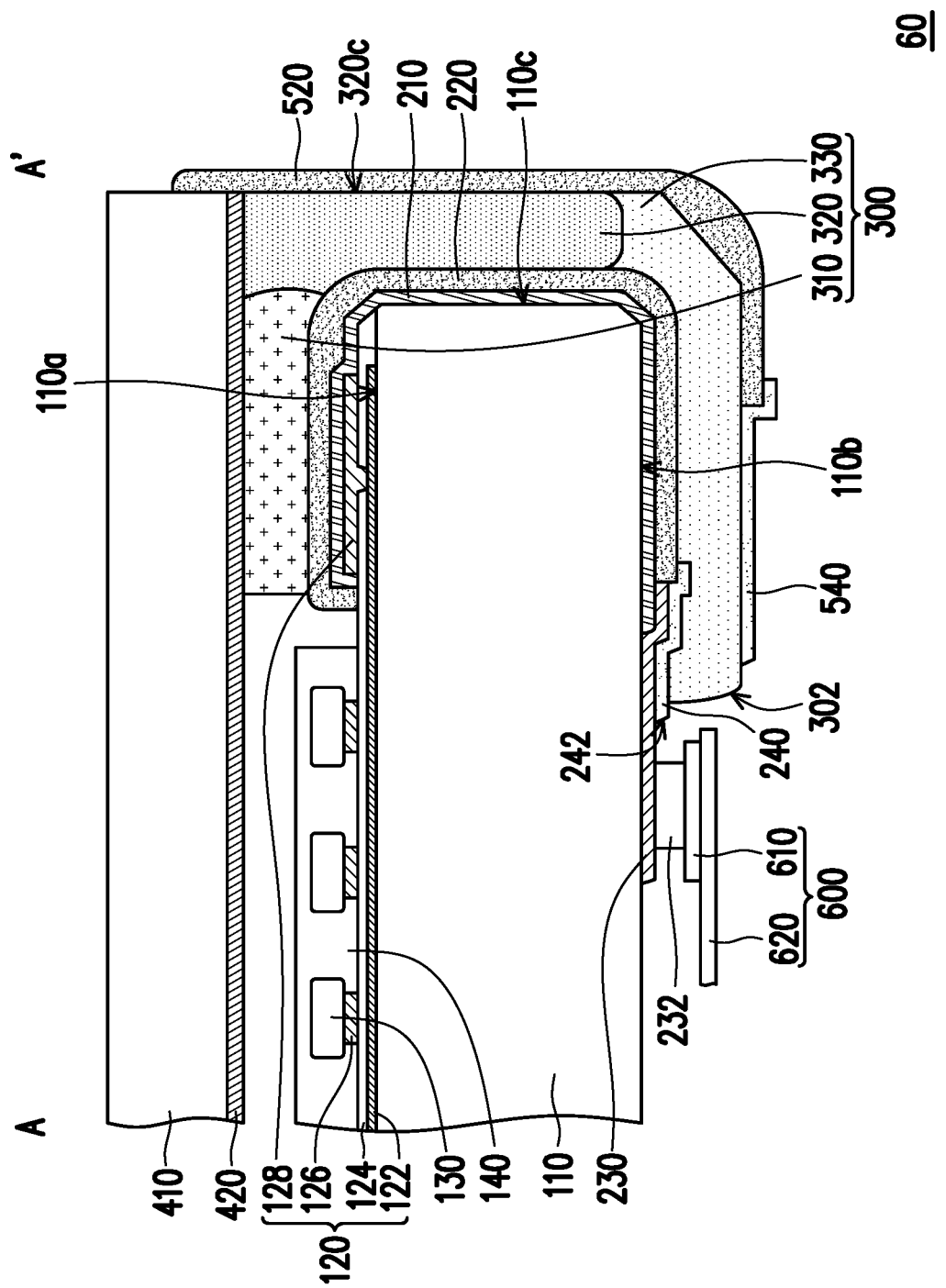
FIG. 7B is a schematic cross-sectional view taken along a sectional line A-A' in FIG. 7A.

FIG. 7A is a schematic bottom view of a side wiring structure 60 according to an embodiment of the disclosure. FIG. 7B is a schematic cross-sectional view taken along a sectional line A-A' in FIG. 7A. Note that the reference numbers and some contents applied in the embodiment depicted in FIG. 7A and FIG. 7B are derived from the embodiment depicted in FIG. 6A to FIG. 6C, the same or similar reference numbers denote the same or like devices, and the same technical contents are omitted. The description of the omitted parts may be referred to as that provided in the previous embodiments and thus will not be repeated hereinafter.

With reference to FIG. 7A and FIG. 7B, in this embodiment, the first insulating adhesive structure 300 includes a groove 302, and the first cover layer 240 includes a groove 242. The groove 302 overlaps the groove 242, and both of the grooves 302 and 242 are located on the second surface 110*b* of the first substrate 110. The first flexible circuit board of the thin-film flip-chip packaging structure 600 is located in the groove 302.

Figure 8A:
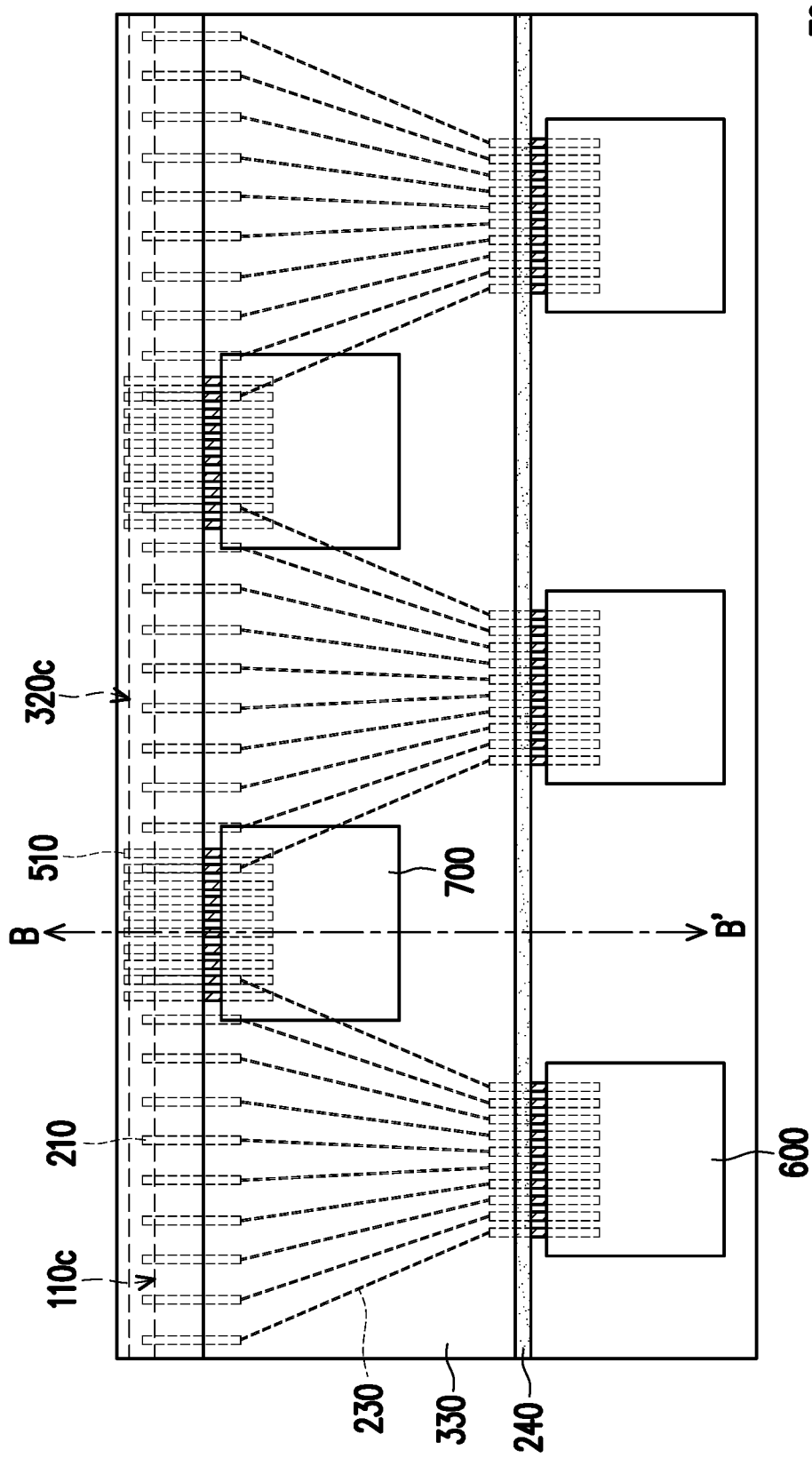
FIG. 8A is a schematic bottom view of a side wiring structure according to an embodiment of the disclosure.
Figure 8B:
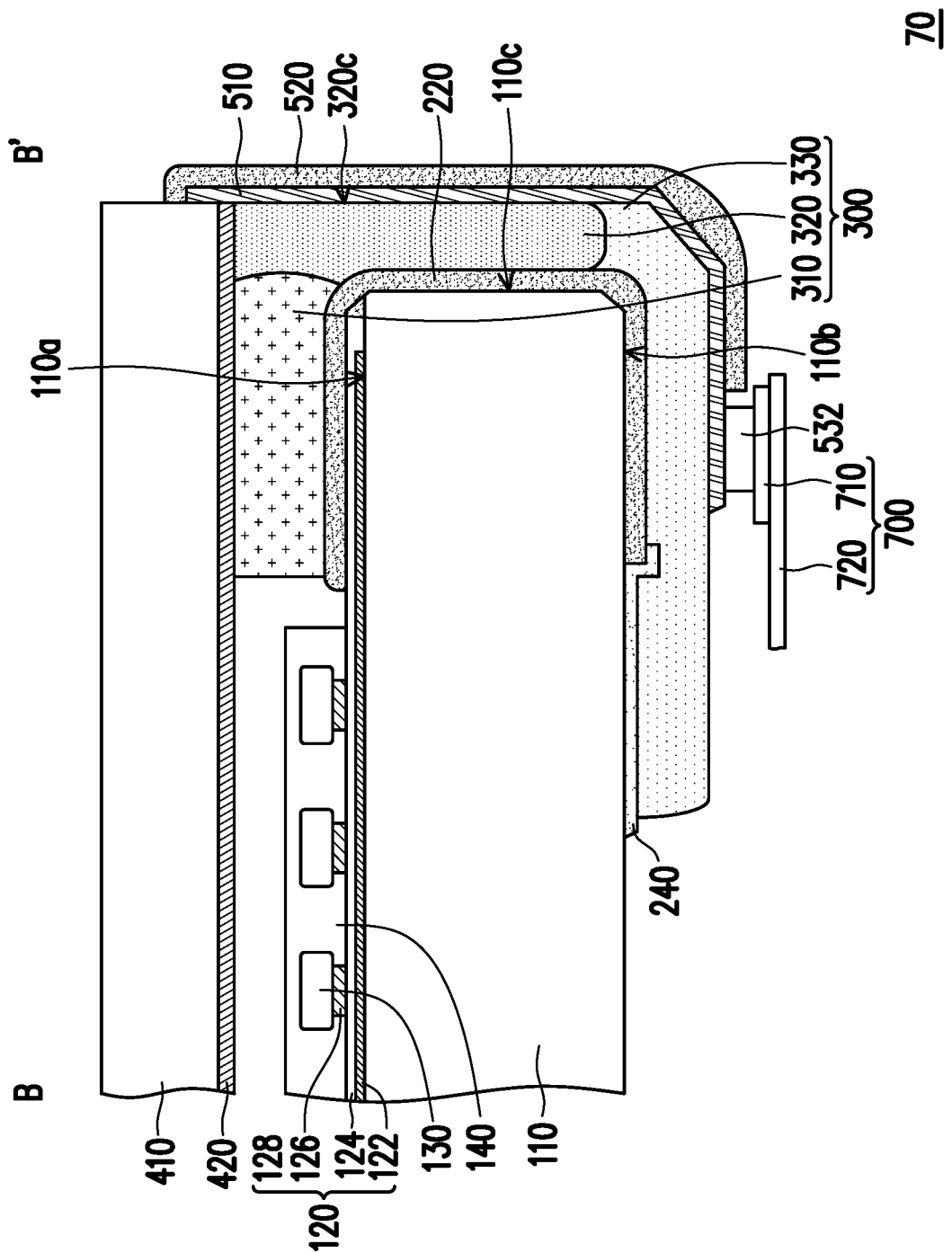
FIG. 8B is a schematic cross-sectional view taken along a sectional line B-B' in FIG. 8A.

FIG. 8A is a schematic bottom view of a side wiring structure 70 according to an embodiment of the disclosure. FIG. 8B is a schematic cross-sectional view taken along a sectional line B-B' in FIG. 8A. Note that the reference numbers and some contents applied in the embodiment depicted in FIG. 8A and FIG. 8B are derived from the embodiment depicted in FIG. 7A and FIG. 7B, the same or similar reference numbers denote the same or like devices, and the same technical contents are omitted. The description of the omitted parts may be referred to as that provided in the previous embodiments and thus will not be repeated hereinafter.

With reference to FIG. 8A and FIG. 8B, in this embodiment, a pin 710 of the thin-film flip-chip packaging structure 700 is connected to the second side wire 510, and thus the second extension line and the second cover layer may be omitted.

Figure 9A:
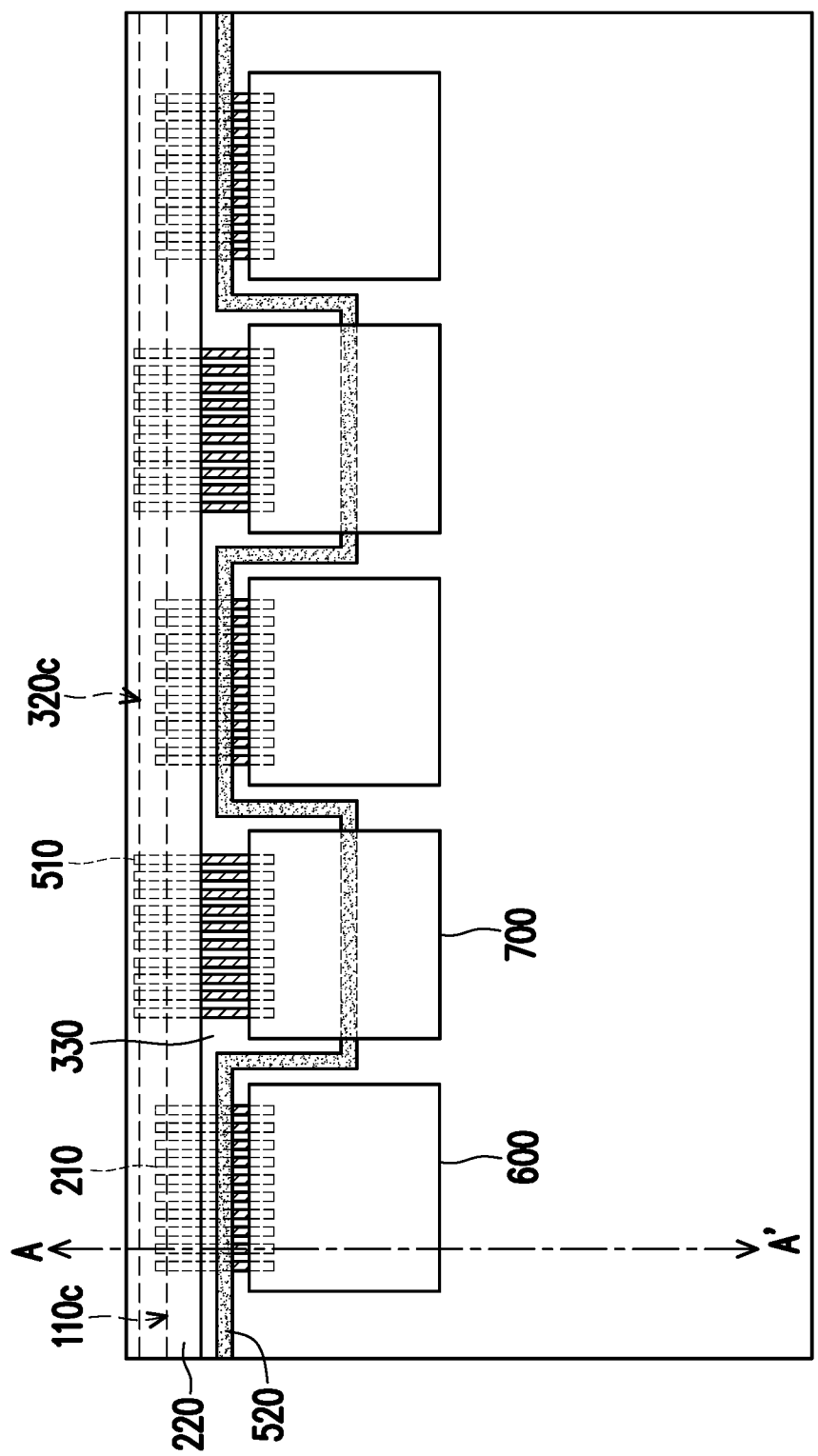
FIG. 9A is a schematic bottom view of a side wiring structure according to an embodiment of the disclosure.
Figure 9B:
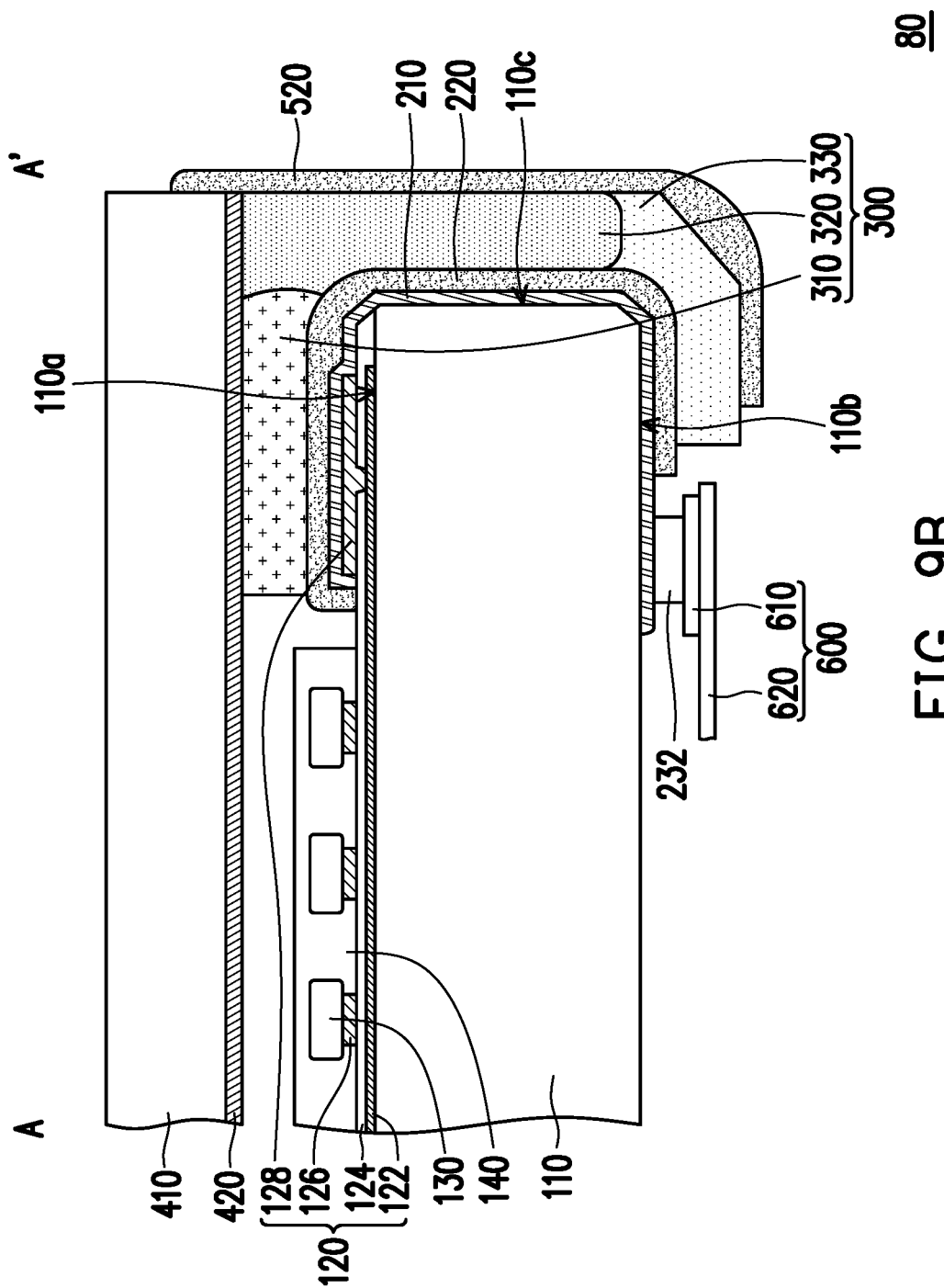
FIG. 9B is a schematic cross-sectional view taken along a sectional line A-A' in FIG. 9A.

FIG. 9A is a schematic bottom view of a side wiring structure 80 according to an embodiment of the disclosure. FIG. 9B is a schematic cross-sectional view taken along a sectional line A-A' in FIG. 9A. Note that the reference numbers and some contents applied in the embodiment depicted in FIG. 9A and FIG. 9B are derived from the embodiment depicted in FIG. 7A and FIG. 7B, the same or similar reference numbers denote the same or like devices, and the same technical contents are omitted. The description of the omitted parts may be referred to as that provided in the previous embodiments and thus will not be repeated hereinafter.

With reference to FIG. 9A and FIG. 9B, in this embodiment, in addition to the pin 610 of the thin-film flip-chip packaging structure 600 being connected to the second side wire 510, the pin 610 of the thin-film flip-chip packaging structure 600 is connected to the first side wire 210, so that the extension line and the cover layer may be omitted.

Figure 10:
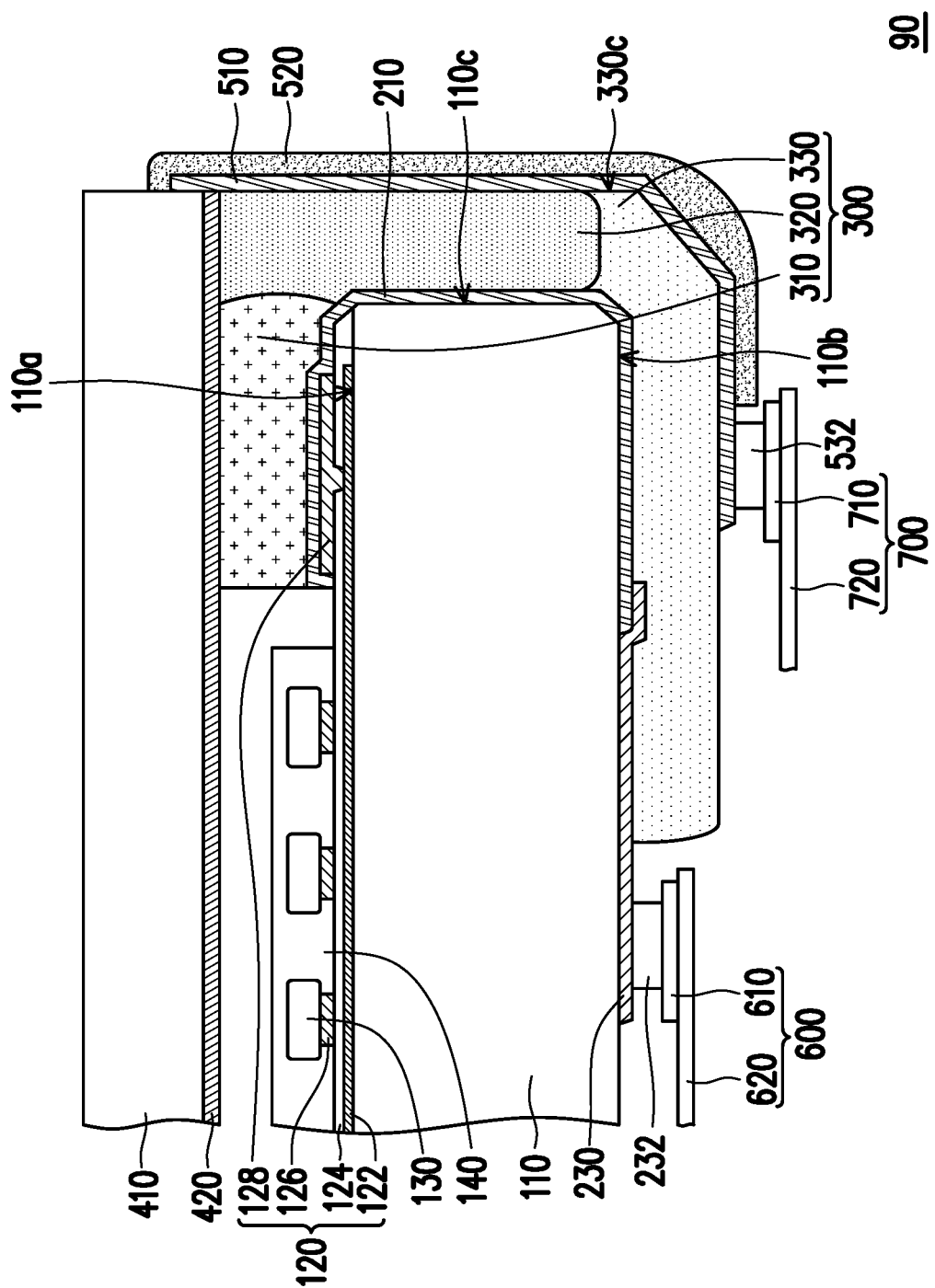
FIG. 10 is a schematic cross-sectional view of a side wiring structure according to an embodiment of the disclosure.

FIG. 10 is a schematic cross-sectional view of a side wiring structure 90 according to an embodiment of the disclosure. Note that the reference numbers and some contents applied in the embodiment depicted in FIG. 10 are derived from the embodiment depicted in FIG. 1, the same or similar reference numbers denote the same or like devices, and the same technical contents are omitted. The description of the omitted parts may be referred to as that provided in the previous embodiments and thus will not be repeated hereinafter.

With reference to FIG. 10, in this embodiment, the first insulating adhesive structure 300 of the side wiring structure 90 directly contacts the first side wire 210 and the first extension line 230. In other words, the first protection layer and the first cover layer are not formed on the first side wire 210 and the first extension line 230.

Figure 11:
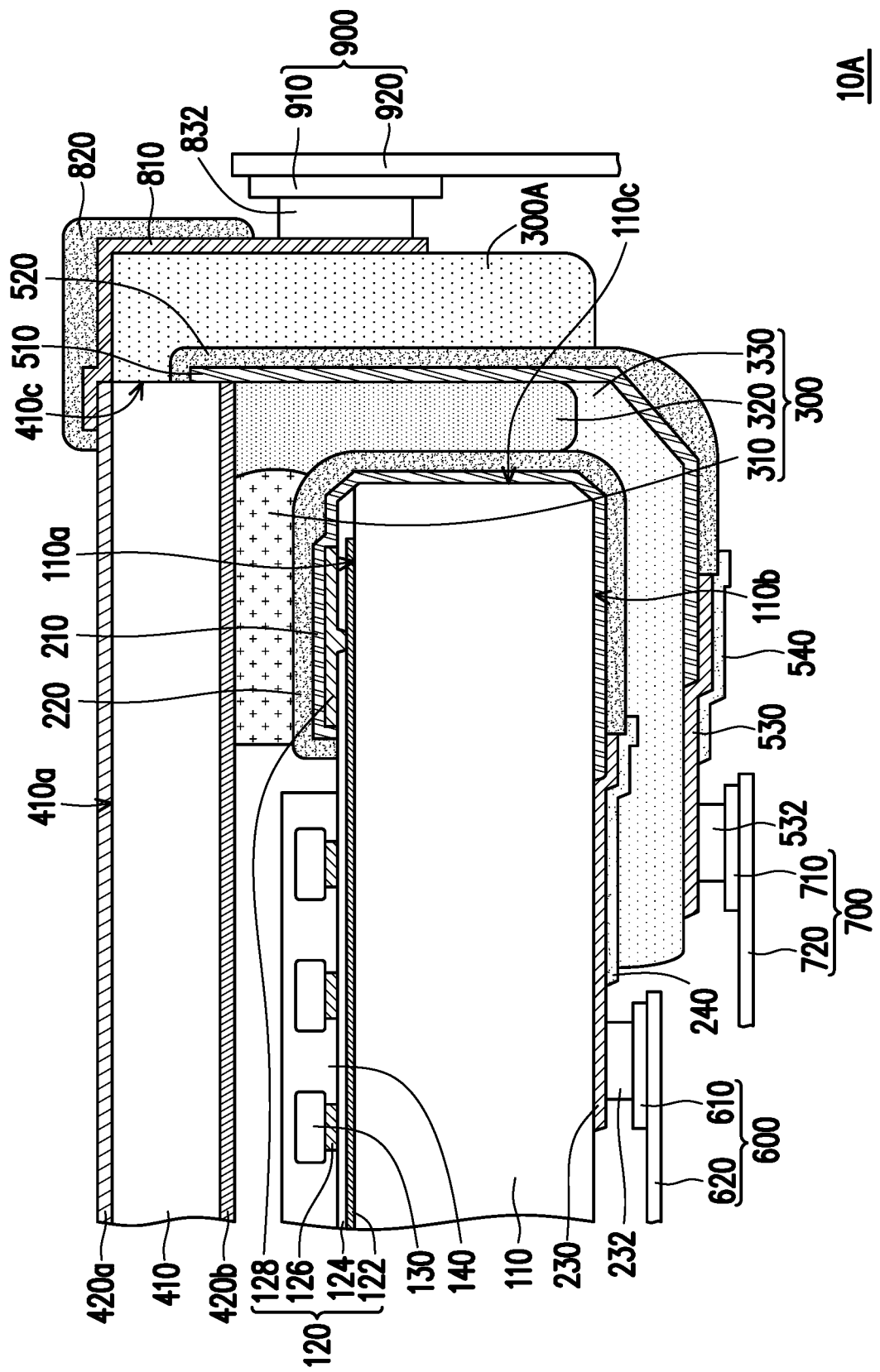
FIG. 11 is a schematic cross-sectional view of a side wiring structure according to an embodiment of the disclosure.

FIG. 11 is a schematic cross-sectional view of a side wiring structure 10A according to an embodiment of the disclosure. Note that the reference numbers and some contents applied in the embodiment depicted in FIG. 11 are derived from the embodiment depicted in FIG. 1, the same or similar reference numbers denote the same or like devices, and the same technical contents are omitted. The description of the omitted parts may be referred to as that provided in the previous embodiments and thus will not be repeated hereinafter.

With reference to FIG. 11, in this embodiment, the side wiring structure 10A further includes a second insulating adhesive structure 300A, a third side wire 810, a third cover layer 820, and a thin-film flip-chip packaging structure 900.

The second insulating adhesive structure 300A is located above the side surface 110*c* of the first substrate 110 and the side surface 410*c* of the second substrate 410, and the second side wire 510 and the second cover layer 520 are located between the first insulating adhesive structure 300 and the second insulating adhesive structure 300A. The third side wire 810 is located on the second insulating adhesive structure 300A, and the second insulating adhesive structure 300A is located between the second side wire 510 and the third side wire 810. The third cover layer 820 is located on the third side wire 810.

The thin-film flip-chip packaging structure 900 is bonded to the third side wire 810. For instance, the thin-film flip-chip packaging structure 900 includes a third flexible circuit board 920 and a pin 910 located on the third flexible circuit board 920. The pin 910 is bonded to the third side wire 810 through a conductive connection structure 832, where the conductive connection structure 832 includes, for instance, a solder material, a conductive adhesive, or any other appropriate material. The third side wire 810 electrically connects the third wiring structure 420*a* located on the first surface 410*a* of the second substrate 410 to the thin-film flip-chip packaging structure 900.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A side wiring structure, comprising:
a first substrate, having a first surface, a second surface opposite to the first surface, and a side surface;
a first wiring structure, located on the first surface of the first substrate;
a first side wire, extending from the first wiring structure on the first surface of the first substrate to the second surface of the first substrate along the side surface of the first substrate;
a first insulating adhesive structure, located above the first side wire and extending from above the first surface of the first substrate to above the side surface of the first substrate;
a second side wire, wherein the first insulating adhesive structure is located between the first side wire and the second side wire;
a first flexible circuit board, electrically connected to the first side wire; and
a second flexible circuit board, electrically connected to the second side wire.

2. The side wiring structure according to claim 1, further comprising:
a second substrate, having a first surface, a second surface opposite to the first surface, and a side surface; and
a second wiring structure, located on the second substrate, wherein the second side wire electrically connects the second wiring structure to the second flexible circuit board.

3. The side wiring structure according to claim 2, wherein the first insulating adhesive structure comprises:
a first insulating adhesive layer, located between the first substrate and the second substrate; and a second insulating adhesive layer, connected to the first insulating adhesive layer and located above the side surface of the first substrate, wherein the first insulating adhesive layer and the second insulating adhesive layer comprise a cured adhesive material.

4. The side wiring structure according to claim 3, wherein a side surface of the second insulating adhesive layer is aligned with a side surface of the second substrate.

5. The side wiring structure according to claim 3, wherein a material of the first insulating adhesive layer comprises a cured encapsulant, photoresist, a sealant, a gap-filling adhesive, or a combination thereof, and a material of the second insulating adhesive layer comprises a cured glass adhesive, an encapsulant, a sealant, a gap-filling adhesive, or a combination thereof.

6. The side wiring structure according to claim 3, wherein the first insulating adhesive structure further comprises a third insulating adhesive layer connected to the second insulating adhesive layer and located above the second surface of the first substrate, and the third insulating adhesive layer comprises a cured adhesive material.

7. The side wiring structure according to claim 2, further comprising:
a first extension line, located above the second surface of the first substrate and electrically connected to the first flexible circuit board and the first side wire; and
a second extension line, located on the first insulating adhesive structure and electrically connected to the second flexible circuit board and the second side wire.

8. The side wiring structure according to claim 2, wherein the second side wire extends from the first insulating adhesive structure to the side surface or the first surface of the second substrate.

9. The side wiring structure according to claim 1, wherein the first insulating adhesive structure comprises a groove located on the second surface of the first substrate, and the first flexible circuit board is located in the groove.

10. The side wiring structure according to claim 1, wherein a junction of the second flexible circuit board and the second side wire is located above the side surface of the first substrate or above the second surface of the first substrate.

11. The side wiring structure according to claim 1, further comprising:
a second insulating adhesive structure, wherein the second side wire is located between the first insulating adhesive structure and the second insulating adhesive structure; and
a third side wire, wherein the second insulating adhesive structure is located between the second side wire and the third side wire.

12. The side wiring structure according to claim 1, further comprising:
a first protection layer, located between the first insulating adhesive structure and the first side wire; and
a second protection layer, wherein the second side wire is located between the first insulating adhesive structure and the second protection layer.

13. A manufacturing method of a side wiring structure, comprising:
providing a first substrate and a first wiring structure, wherein the first substrate has a first surface, a second surface opposite to the first surface, and a side surface, and the first wiring structure is located on the first surface of the first substrate;
forming a first side wire on the first wiring structure, wherein the first side wire extends from the first wiring structure to above the second surface of the first substrate along the side surface of the first substrate;
forming a first insulating adhesive structure above the first side wire, wherein the first insulating adhesive structure extends from above the first surface of the first substrate to above the side surface of the first substrate;
forming a second side wire on the first insulating adhesive structure, wherein the first insulating adhesive structure is located between the first side wire and the second side wire;
electrically connecting a first flexible circuit board to the first side wire; and
electrically connecting a second flexible circuit board to the second side wire.

14. The manufacturing method according to claim 13, wherein a method of forming the first insulating adhesive structure comprises:
forming a first adhesive material layer above the first surface of the first substrate;
curing the first adhesive material layer;
forming a second adhesive material layer above the side surface of the first substrate;
curing the second adhesive material layer; and
polishing the cured second adhesive material layer.

15. The manufacturing method according to claim 14, wherein the method of forming the first insulating adhesive structure further comprises:
forming a third adhesive material layer above the second surface of the first substrate; and
curing the third adhesive material layer.

16. The manufacturing method according to claim 14, further comprising:
adhering a second substrate and a second wiring structure located on the second substrate to the first adhesive material layer;
simultaneously polishing the cured second adhesive material layer and the second substrate; and
forming the second side wire on the cured second adhesive material layer and the second substrate.

17. The manufacturing method according to claim 13, further comprising:
forming a first extension line above the second surface of the first substrate, wherein the first side wire is electrically connected to the first extension line; and
forming the first insulating adhesive structure above the first side wire and the first extension line.

18. The manufacturing method according to claim 13, further comprising:
forming a second extension line on the first insulating adhesive structure, wherein the second extension line is located above the second surface of the first substrate, and the second side wire is electrically connected to the second extension line.

19. The manufacturing method according to claim 13, further comprising:
forming a first protection layer on the first side wire, wherein the first insulating adhesive structure is formed on the first protection layer; and
forming a second protection layer on the second side wire.

* * * * *